(12) United States Patent
Okada et al.

(10) Patent No.: US 9,155,159 B2
(45) Date of Patent: Oct. 6, 2015

(54) LIGHT EMITTING DEVICE HAVING QUANTUM CUT DOTS WITH A PROTECTING MATERIAL AND PROLONGED DRIVE LIFETIME AND GOOD COLOR PURITY

(75) Inventors: Masato Okada, Tukuba (JP); Shigehiro Ueno, Tokyo-To (JP); Tomonori Akai, Nagareyama (JP); Masaya Shimogawara, Tukuba (JP); Seiji Take, Nagareyama (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 485 days.

(21) Appl. No.: 12/680,046

(22) PCT Filed: Sep. 29, 2008

(86) PCT No.: PCT/JP2008/067669
§ 371 (c)(1),
(2), (4) Date: Jun. 1, 2010

(87) PCT Pub. No.: WO2009/041689
PCT Pub. Date: Apr. 2, 2009

(65) Prior Publication Data
US 2010/0237322 A1    Sep. 23, 2010

(30) Foreign Application Priority Data

Sep. 28, 2007  (JP) ................................ 2007-256858
Sep. 26, 2008  (JP) ................................ 2008-249144

(51) Int. Cl.
*H01L 33/04* (2010.01)
*H01L 51/54* (2006.01)
*H05B 33/14* (2006.01)
*H01L 51/50* (2006.01)
*H01L 51/00* (2006.01)

(52) U.S. Cl.
CPC ............ *H05B 33/145* (2013.01); *H01L 51/502* (2013.01); *H01L 51/5012* (2013.01); *H01L 51/0039* (2013.01); *H01L 51/0043* (2013.01)

(58) Field of Classification Search
None
See application file for complete search history.

(56) References Cited

U.S. PATENT DOCUMENTS

| 2003/0042850 | A1* | 3/2003 | Bertram et al. | 313/504 |
| 2003/0068524 | A1* | 4/2003 | Hatwar | 428/690 |
| 2005/0238915 | A1* | 10/2005 | Li et al. | 428/690 |
| 2007/0077594 | A1 | 4/2007 | Hikmet et al. | |
| 2007/0152568 | A1* | 7/2007 | Lai et al. | 313/504 |
| 2008/0206565 | A1 | 8/2008 | Takahashi et al. | |

FOREIGN PATENT DOCUMENTS

| JP | 2003-138033 A1 | 5/2003 |
| JP | 2005-502176 A1 | 1/2005 |
| JP | 2007-513478 A1 | 5/2007 |
| JP | 2008-214363 A1 | 9/2008 |

OTHER PUBLICATIONS

Huang et al. "Synthesis and characterization of CdS/multiwalled carbon nanotube heterojunctions" Nanotechnology 2004, 15, 1855-1860. Year of publication: 2004.*
Fjuihira et al. "Study of Hole Injection in Hole-Only Single-Carrier Devices" Multifunctional Conducting Molecular Materials 2006, 253-269. Year of publication: 2006.*
K.E. Meusburger, *Pesticide Formulations: Innovations and Developments*, Chapter 14 "Determination of Cohesive Energy Density Parameters for Developing Pesticide Formulations" American Chemical Society, 1988, pp. 151-162.
Robert F. Fedors, "A Method for Estimating Both the Solubility Parameters and Molar Volumes of Liquids," Polymer Engineering and Science, Feb. 1974, vol. 14, No. 2, pp. 147-154.

* cited by examiner

*Primary Examiner* — Andrew K Bohaty
(74) *Attorney, Agent, or Firm* — Burr & Brown, PLLC

(57) ABSTRACT

A QD protecting material having high compatibility with a binder component in a luminescent layer. The luminescent layer contains, as a part of its chemical structure, a compound containing a moiety A having a sum atomic weight MA of 100 or more and quantum dots protected by a protecting material, the protecting material contains, as a part of its chemical structure, a linking group connected to a quantum dot surface and a moiety B that has a sum atomic weight MB of 100 or more, satisfies a relationship between MB and MA represented by $|MA-MB|/MB \geq 2$, and satisfies the requirement that the sum atomic weight MB is larger than one-third of the molecular weight of the protecting material, and a solubility parameter SA of the moiety A and a solubility parameter SB of the moiety B satisfy a relationship represented by $|SA-SB| \geq 2$.

6 Claims, 5 Drawing Sheets

LIGHT EMITTING DEVICE HAVING QUANTUM CUT DOTS WITH A PROTECTING MATERIAL AND PROLONGED DRIVE LIFETIME AND GOOD COLOR PURITY

CROSS-REFERENCE TO RELATED APPLICATIONS

This application is based upon and claims the benefit of priority under Article 4 of the Paris Convention from the prior Japanese Patent Applications No. 256858/2007 filed on Sep. 28, 2007 and No. 249144/2008 filed on Sep. 26, 2008, the entire contents of the specifications, drawings, etc. of which are incorporated herein by reference.

FIELD OF INVENTION

The present invention relates to a light emitting device using quantum dots protected by a protecting material.

BACKGROUND ART

Light emitting devices are expected to be developed into a wide range of fundamental light emitting devices and applications, for example, organic electroluminescent devices (hereinafter referred to as organic EL device) and inorganic-organic hybrid light emitting devices.

Organic EL devices are charge injection-type selfluminous devices utilizing luminescence produced upon recombination of electrons and holes arrived at the luminescent layer. Organic EL devices have been energetically developed since T. W. Tang et al. demonstrated in 1987 that a device with a thin film, composed of a fluorescent metal chelate complex and diamine-type molecules, stacked thereon exhibits luminescence with high brightness at low drive voltage.

Conventional organic fluorescent materials and organic phosphorescent materials as the luminescent material for the luminescent layer have a broader spectrum and a lower color purity as compared with inorganic fluorescent materials, and a color filter or a resonator structure should be used for color purity improvement purposes. The use of the color filter or the resonator structure poses problems, for example, lowered utilization efficiency of light produced by luminescence, dependency of luminescent color upon the viewing angle, and increased production cost.

In order to solve the above problems, the use of inorganic semiconductor crystals of nano size called quantum dots (QD) instead of conventional organic materials has been proposed (patent document 1: Japanese Translation of PCT Publication No. 522005/2005). QD is mixed with an organic host material (a binder component) in the luminescent layer and forms a luminescent matrix that is held between the electrodes and is formed within the luminescent layer. The quantum dots are divided into semiconductor fine particles of which the luminescent color is regulated by regulating the particle diameter and dopant-containing semiconductor fine particles. The former quantum dots, i.e., semiconductor fine particles, emit light at a wavelength determined by the size (particle diameter) thereof. On the other hand, the latter quantum dots, i.e, dopant-containing semiconductor fine particles, emit light having a luminescent color inherent in the dopant used. The semiconductor fine particles and the dopant-containing semiconductor fine particles each exhibit a spectrum having a narrow half-value width and a high color purity. In particular, in the former QD, the wavelength of light emitted from QD can be accurately and continuously regulated by regulating the particle diameter in the production of QD and can realize a wider range of color reproduction than the latter QD restricted by a luminescent color inherent in the dopant.

DISCLOSURE OF INVENTION

The quantum dots, however, are an inorganic structure and thus are disadvantageous in that mixing the quantum dots with a solvent containing the organic binder component in the luminescent layer to prepare a solution causes phase separation to form an aggregate of quantum dots which causes a change in size of the quantum dots. A change in the size of the quantum dots poses problems such as a change in luminescence wavelength or extinction which makes it impossible to provide a desired color and/or a lowering in luminescence efficiency due to a lowering in internal quantum efficiency by the extinction and/or a change in transport properties of carriers which leads to a higher voltage or a change in carrier balance which leads to a lowered luminescence efficiency.

In order to solve the above problems, methods are disclosed in which QD is protected using a compound as a QD protecting material such as trioctylphosphine oxide (TOPO) or mercapto ethanol in which moieties other than the functional group that acts on QD are composed mainly of only an alkyl chain to improve the dispersibility of QD in a solution state (patent document 1 and patent document 2: Japanese Patent Application Laid-Open No. 38634/2005).

Further, non-patent document 1 [SID-2006 proceedings (The Society for Information Display)] discloses that QD protected by TOPO is mixed with a low-molecular weight organic EL material (a binder component) in a solution to allow the protected QD to be unevenly distributed on the surface of the film formed and thus to form a monomolecular layer of QD which lowers the drive voltage of the organic EL device.

Non-patent document 1 describes that a monomolecular layer of the protected QD is formed through a mechanism in which phase separation occurs due to a difference in hydrophobicity between the alkyl chain possessed by TOPO that protects QD and the aromatic hydrocarbon constituting the triphenyldiamine derivative (TPD) that is an organic EL material (a binder component) and QD covered with the alkyl chain is unevenly distributed on the air interface side.

In non-patent document 1, a single-layer film is formed by actively utilizing mismatching in compatibility between a protecting material composed mainly of an alkyl chain such as TOPO or mercapto ethanol, and a binder component composed mainly of an aromatic hydrocarbon. The poor compatibility, however, indicates that the stability of adhesion between the films is low, and this low stability poses a problem of lifetime properties. Non-patent document 1 defines the lifetime as a time in which the brightness is halved when the organic EL device is continuously driven at a constant current, and the lifetime of drive of the device increases with increasing the brightness half-time.

Further, as described in non-patent document 1, the protecting material composed mainly of an alkyl chain, for example, TOPO or mercapto ethanol has poor compatibility with the binder component composed mainly of an aromatic hydrocarbon, and, thus, the QD cannot be evenly dispersed in the binder without difficulties.

Furthermore, in the method disclosed in non-patent document 1, the formation of an even monomolecular film of QD by single coating is difficult, and defects are likely to occur. The presence of defects in the monomolecular layer of QD causes current leakage, resulting in short lifetime. For this reason, an increased area and a prolonged lifetime of the light emitting device cannot be realized without difficulties by the method disclosed in non-patent document 1.

The present inventors have aimed at the compatibility between the QD protecting material and the binder component in the luminescent layer as a measure for suppressing a deterioration in brightness of the light emitting device.

When a thin film is formed by mixing materials different from each other in solubility parameter (SP value), the thin film is instable and is in a quasi-stable state. In this thin film, when the organic molecules can be moved, for example, when the thin film has a temperature of the glass transition temperature (Tg) of the organic molecules or above, or when the device is being driven in the case where the film has a temperature of Tg or below, the organic molecules are moved to an energetically stable state, that is, are moved so that the area of contact between the QD protecting material and the binder is minimized.

Here it should be noted that the organic molecules can be moved even at a temperature of Tg or below when the device is being driven. The electron structure of the molecules of the carrier transport material repeats a ground state and a cation state or an anion state every time carriers are transported to adjacent molecules. The ground state and the cation state are generally different from each other in the shape of molecule, and, thus, the molecules perform severe intramolecular motion while transporting carriers. Within the thin film in which the molecules come close to each other, the intramolecular motion is converted to a relative motion among the molecules. That is, when the thin film has a temperature of Tg or below, the molecules can be moved when the device being driven.

On the other hand, even when the organic molecules can be moved, if there is no difference in SP value between the QD protecting material and the binder, the dispersed state is an energetically stable state. Thus, the aggregated state of the film is less likely to change and is stable. That is, a light emitting device that has little or no aggregation-derived extinction or change in luminescence wavelength, or change in carrier transport properties and can realize a prolonged drive life time.

The light emitting device according to the present invention comprises: a substrate; two or more opposed electrodes provided on the substrate; and a luminescent layer provided between two of the electrodes; the light emitting device further optionally comprising a metal layer provided on the electrodes, characterized in that the luminescent layer contains, as a part of its chemical structure, a compound containing a moiety A having a sum atomic weight MA of 100 or more and quantum dots protected by a protecting material, the protecting material contains, as a part of its chemical structure, a linking group having the function of connecting to a quantum dot surface and a moiety B that has a sum atomic weight MB of 100 or more, satisfies a relationship between the sum atomic weight MB and the sum atomic weight MA represented by formula (I), and satisfies the requirement that the sum atomic weight MB is larger than one-third of the molecular weight of the protecting material, and a solubility parameter SA of the moiety A and a solubility parameter SB of the moiety B satisfy a relationship represented by formula (II):

$|MA-MB|/MB \leq 2$        formula (I); and $|SA-SB| \leq 2$        formula (II).

When the compound contained in the luminescent layer and the quantum dot (QD) protecting material contain the moiety A and the moiety B, respectively, while the moiety A and the moiety B satisfy the relationships represented by formulae (I) and (II), the molecule polarity matching between the moiety A and the moiety B is good and the compatibility of the compound contained in the luminescent layer with the QD protecting material is improved, whereby the aggregation of QD protected by the protecting material can be prevented and light emitting devices having a prolonged drive lifetime and a good color purity can be provided.

The higher the content of the compound contained in the luminescent layer, the higher the effect of homogeneously dispersing the QD protecting material in the luminescent layer. A binder component in the luminescent layer may be mentioned as this compound, and, in the present invention, for convenience, the compound contained in the luminescent layer will be referred to as a binder component in the luminescent layer or a binder component.

In the light emitting device according to the present invention, from the viewpoint of realizing high color purity, the quantum dots are preferably semiconductor fine particles and/or dopant-containing semiconductor fine particles that emit light having a color regulated by the particle diameter of the semiconductor fine particles per se and/or the particle diameter of the dopant-containing semiconductor fine particles per se.

In the light emitting device according to the present invention, preferably, the protecting material has a structure represented by chemical formula (I):

X—Y        Chemical formula (1)

wherein X represents a moiety containing the moiety B; and Y represents a linking group.

In the light emitting device according to the present invention, from the viewpoint of homogeneously dispersing QD protected by the protecting material in the luminescent layer, preferably, the moiety B has the same skeleton as the moiety A, or a similar skeleton which is the same skeleton as the moiety A except that the skeleton further has a spacer structure.

In the light emitting device according to the present invention, from the viewpoint of homogeneously dispersing QD protected by the protecting material in the luminescent layer, preferably, the sum MB of the atomic weights of atoms contained in the moiety B is larger than one-third of the sum of the atomic weights of atoms contained in X.

A group selected from the group consisting of formulae (Y-1) to (Y-9) may be mentioned as the linking group Y represented by chemical formula (1).

[Chemical formula 1]

(Y-1)

(Y-2)

(Y-3)

-continued

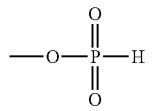   (Y-4)

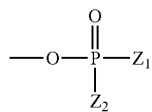   (Y-5)

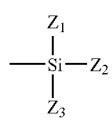   (Y-6)

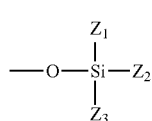   (Y-7)

—NH$_2$   (Y-8)

—SH   (Y-9)

In the light emitting device according to the present invention, from the viewpoint of homogeneously dispersing QD protected by the protecting material in the luminescent layer, preferably, the compound constituting the luminescent layer is a compound represented by chemical formula (2), and the protecting material is a compound represented by chemical formula (3).

[Chemical formula 2]

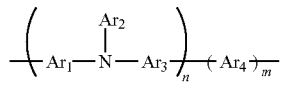   Chemical formula (2)

wherein $Ar_1$ to $Ar_4$, which may be the same or different, represent an unsubstituted or substituted aromatic hydrocarbon group having 6 to 60 carbon atoms involved in a conjugated bond, or an unsubstituted or substituted heterocyclic group having 4 to 60 carbon atoms involved in a conjugated bond; n is 0 to 10000 and m is 0 to 10000, provided that n+m=1 to 20000; the two repeating units are arranged in any order; when two or more repeating units represented by the repeating unit —($Ar_1$(—$Ar_2$)—$Ar_3$)— are present in an identical molecule, they may be the same or different; and, when two or more repeating units represented by —($Ar_4$)— are present in an identical molecule, they may be the same or different, and

[Chemical formula 3]

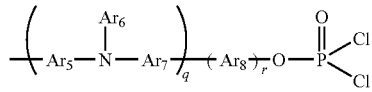   Chemical formula (3)

wherein $Ar_5$ to $Ar_8$, which may be the same or different, represent an unsubstituted or substituted aromatic hydrocarbon group having 6 to 60 carbon atoms involved in a conjugated bond, or an unsubstituted or substituted heterocyclic group having 4 to 60 carbon atoms involved in a conjugated bond; q is 0 to 10 and r is 0 to 10, provided that q+r=1 to 20; the two repeating units are arranged in any order; the linking group —O—P(=O)Cl$_2$ may be linked to a repeating unit —($Ar_8$)— or may be linked to another repeating unit —($Ar_5$(—$Ar_6$)—$Ar_7$)—; when two or more repeating units represented by the repeating unit —($Ar_5$(—$Ar_6$)—$Ar_7$)— are present in an identical molecule, they may be the same or different; and, when two or more repeating units represented by —($Ar_8$)— are present in an identical molecule, they may be the same or different.

In the light emitting device according to the present invention, preferably, from the viewpoint of the migration efficiency of excitation energy, the thickness of the luminescent layer is 0.1~4000 nm.

In the light emitting device according to the present invention, from the viewpoints of eliminating the need to use a vapor deposition apparatus, realizing high productivity, and homogeneously dispersing QD protected by the protecting material in the luminescent layer, preferably, the luminescent layer has been formed by a solution coating method.

In one embodiment of the light emitting device according to the present invention, the EL device may comprise, in addition to the QD-containing luminescent layer, a luminescent layer which exhibits organic EL luminescence.

According to the present invention, when the compound contained in the luminescent layer and the QD protecting material contain the moiety A and the moiety B, respectively, while the moiety A and the moiety B satisfy the relationships represented by formulae (I) and (II), the molecule polarity matching between the moiety A and the moiety B is good and the compatibility of the compound contained in the luminescent layer with the QD protecting material is improved, whereby the aggregation of QD protected by the protecting material can be prevented and the protected QD can be homogeneously dispersed in the luminescent layer. Thus, light emitting devices can be provided that have a prolonged drive lifetime and a high color purity and can easily be produced.

DESCRIPTION OF REFERENCE CHARACTERS

Figure 1:
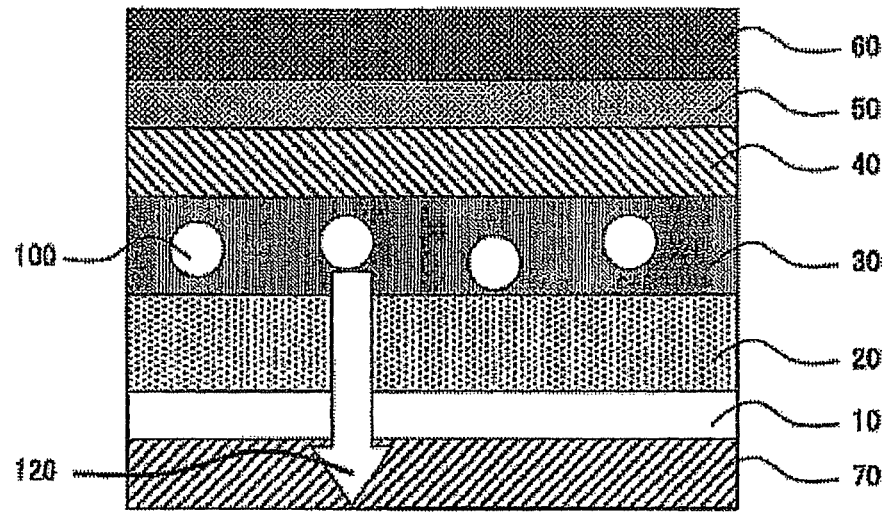
FIG. 1 is a conceptual cross-sectional view showing one example of the layer construction of a light emitting device according to the present invention.

10 Electrode
20 Hole transport layer
30 Luminescent layer
31 Luminescent layer
40 Electron transport layer
50 Electron injection layer
60 Electrode
70 Substrate
100 Quantum dot
110 Organic luminescent dopant
120 EL luminescence
130 PL luminescence

DETAILED DESCRIPTION OF THE INVENTION

The light emitting device according to the present invention comprises: a substrate; two or more opposed electrodes provided on the substrate; and a luminescent layer provided between two of the electrodes; the light emitting device further optionally comprising a metal layer provided on the electrodes, characterized in that
the luminescent layer contains, as a part of its chemical structure, a compound containing a moiety A having a sum atomic weight MA of 100 or more and quantum dots protected by a protecting material,
the protecting material contains, as a part of its chemical structure, a linking group having the function of connecting to a quantum dot surface and a moiety B that has a sum atomic weight MB of 100 or more, satisfies a relationship between the sum atomic weight MB and the sum atomic weight MA represented by formula (I), and satisfies the requirement that the sum atomic weight MB is larger than one-third of the molecular weight of the protecting material, and
a solubility parameter SA of the moiety A and a solubility parameter SB of the moiety B satisfy a relationship represented by formula (II):

$|MA-MB|/MB \leq 2$        formula (I); and $|SA-SB| \leq 2$        formula (II).

When the compound contained in the luminescent layer and the quantum dot (QD) protecting material contain the moiety A and the moiety B, respectively, while the moiety A and the moiety B satisfy the relationships represented by formulae (I) and (II), the molecule polarity matching between the moiety A and the moiety B is good and the compatibility of the compound contained in the luminescent layer with the QD protecting material is improved, whereby, in film formation, the aggregation of QD protected by the protecting material can be prevented and light emitting devices having a prolonged drive lifetime and a good color purity can be provided.

In the present invention, the sum of atomic weights refers to the sum of atomic weights of all the atoms contained in a part of a molecule.

In one embodiment of the light emitting device according to the present invention, the EL device may also comprise at least a luminescent layer as the luminescent layer.

The layer construction of a light emitting device according to the present invention will be described.

FIG. 1 is a conceptual cross-sectional view showing a basic layer construction of a light emitting device according to the present invention. The layer construction of the light emitting device according to the present invention basically comprises a substrate 70, an electrode 10 provided on the substrate 70, and a hole transport layer 20, a luminescent layer 30, an electron transport layer 40, an electron injection layer 50, and an electrode 60 stacked in that order on a surface of the electrode 10.

The hole transport layer 20 functions to transport holes injected from the electrode 10 into the luminescent layer 30. A hole injection layer may also be inserted into between the hole transport layer and the electrode from the viewpoint of promoting the injection of the holes.

Figure 2:
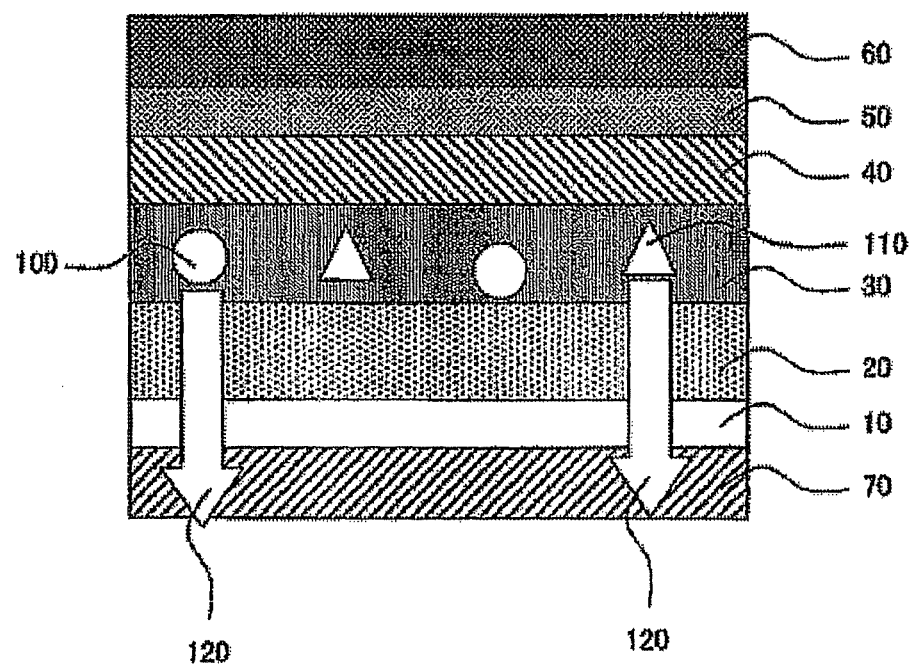
FIG. 2 is a conceptual cross-sectional view showing another one example of the layer construction of a light emitting device according to the present invention.
Figure 3:
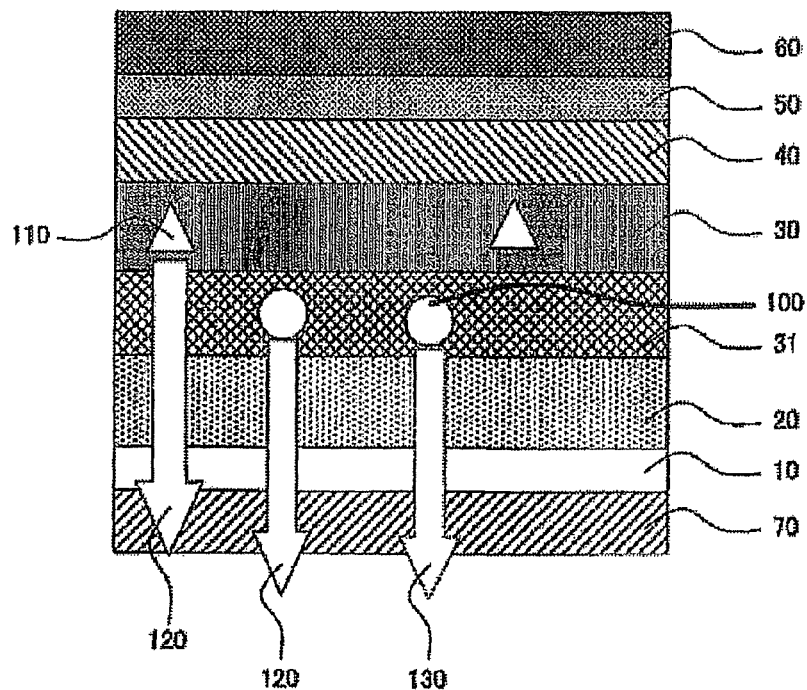
FIG. 3 is a conceptual cross-sectional view showing another one example of the layer construction of a light emitting device according to the present invention.
Figure 4:
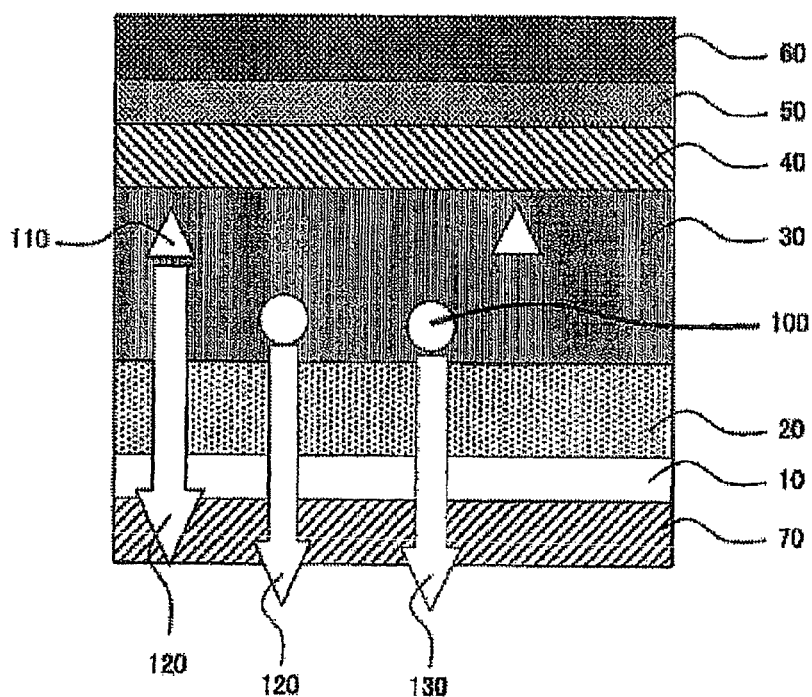
FIG. 4 is a conceptual cross-sectional view showing another one example of the layer construction of a light emitting device according to the present invention.
Figure 5:
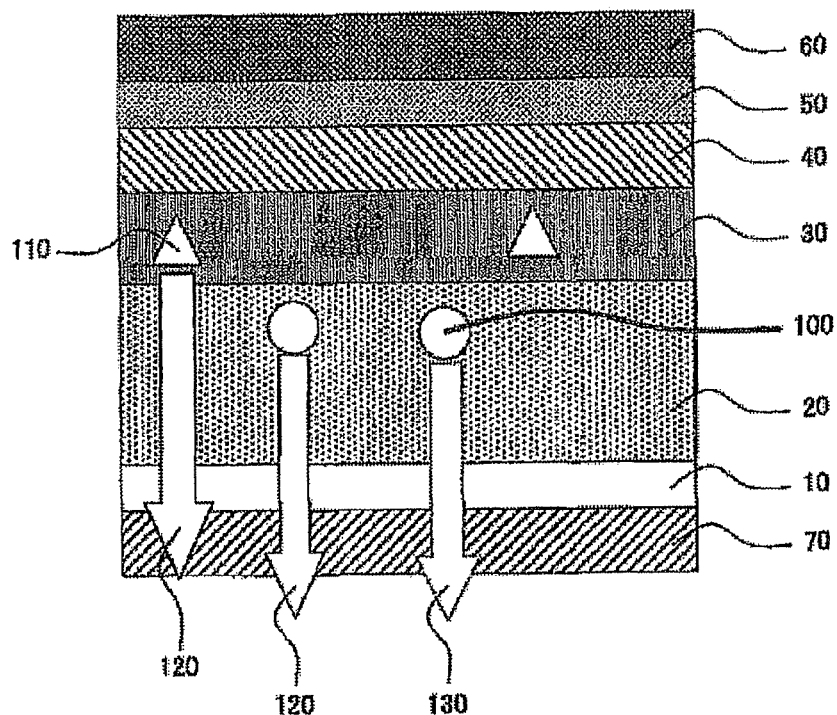
FIG. 5 is a conceptual cross-sectional view showing another one example of the layer construction of a light emitting device according to the present invention.

The luminescent layer 30 functions to emit light. In the luminescent layer, QD contained in the luminescent layer emits light. Further, as shown in FIG. 2, the luminescent layer may contain an organic fluorescent material or an organic phosphorescent material. When a plurality of luminescent materials emit light, as shown in FIGS. 1 to 5, electroluminescent light emission and/or photoluminescent (PL) light emission may occur. The luminescent layer may have a single-layer structure or a multilayer structure as shown in FIG. 3. As shown in FIG. 5, the hole transport layer may contain a luminescent material.

The electron transport layer 40 functions to transport electrons injected from the electrode 60 to the luminescent layer 30. A hole block layer may also be inserted into between the electron transport layer and the luminescent layer to prevent the holes from going through the luminescent layer. Further, an electron injection layer may also be inserted between the electron transport layer and the electrode 60 to promote the injection of the electrons.

The electrode 60 is provided at such a position that the hole transport layer 20 and the luminescent layer 30 exist between the electrode 60 and the counter electrode 10. If necessary, a third electrode (not shown) may be provided. An electric field is applied across the electrodes to develop the function of the organic device.

The layer construction of the light emitting device according to the present invention is not limited to the above embodiment, and any layer construction which is substantially identical to and exhibits the same function and effect as the technical idea described in the claims of the present invention is embraced in the technical scope of the present invention.

Each of layers constituting the light emitting device according to the present invention will be described.

<Luminescent Layer>

The luminescent layer included in the light emitting device according to the present invention is formed as a mixed film that comprises quantum dots protected by a QD protecting material and a binder component having a binding ability for forming the luminescent layer as indispensable components and may further contain other components, for example, conventional inorganic fluorescent materials, and organic luminescent materials and charge transport materials commonly known in organic EL devices and the like without departing from the subject matter of the present invention.

The luminescent layer in the present invention comprises, as a part of its chemical structure, a compound comprising a moiety A having a sum atomic weight MA of 100 or more as a constituent. The content of this compound should be high enough to exhibit interaction with the quantum dots protected by the QD protecting material. Accordingly, the compound is preferably a binder material for the luminescent layer. In the following description, for convenience, the "compound that contains a moiety A having a sum atomic weight (MA) of not less than 100 and constitutes the luminescent layer" is sometimes called "binder." The compound, however, may be a component that is different from a binder material in a strict sense.

<Compound that Contains Moiety A Having Sum Atomic Weight (MA) of not Less than 100 and Constitutes Luminescent Layer (Binder Component)>

The binder component may be selected from host materials for the luminescent layer and charge transport materials or other organic binder materials that are commonly used in conventional organic EL devices.

Binder materials for the luminescent layer used as the host material for the luminescent layer in organic EL devices include, for example, coloring matter luminescent materials, for example, arylamine derivatives, anthracene derivatives, oxadiazole derivatives, oxazole derivatives, oligothiophene derivatives, carbazole derivatives, cyclopentadiene derivatives, silole derivatives, distyrylbenzene derivatives, distyrylpyrazine derivatives, distyrylarylene derivatives, silole derivatives, stilbene derivatives, spiro compounds, thiophene ring compounds, tetraphenylbutadiene derivatives, triazole derivatives, triphenylamine derivatives, trifumanylamine derivatives, pyrazoloquinoline derivatives, hydrazone derivatives, pyrazoline dimmers, pyridine ring compounds, fluorene derivatives, phenanthrolines, perinone derivatives, and perylene derivatives. Dimers, trimers, and oligomers of these luminescent materials, and compounds of two or more derivatives may also be used.

Specific examples of triphenylamine derivatives include N,N'-bis-(3-methylphenyl)-N,N'-bis-(phenyl)-benzidine (TPD) and 4,4',4"-tris(3-methyl phenylphenylamino)triphenylamine (MTDATA). Specific examples of arylamines include bis(N-(1-naphthyl-N-phenyl)benzidine) (α-NPD). Specific examples of oxadiazole derivatives include (2-(4-biphenylyl)-5-(4-tert-butylphenyl)-1,3,4-oxadiazole) (PBD). Specific examples of anthracene derivatives include 9,10-di-2-naphthylanthracene (DNA). Specific examples of carbazole derivatives include 4,4-N,N'-dicarbazole-biphenyl (CBP) and 1,4-bis(2,2-diphenylvinyl)benzene (DPVBi). Specific examples of phenanthrolines include bathocuproine and bathophenanthroline. These materials may be used either solely or in a combination of two or more.

Further binder materials for the luminescent layer used as the host material for a metal complex luminescent layer in organic EL devices include metal complex luminescent materials, for example, aluminum quinolinol complexes, benzoquinolinol beryllium complexes, benzooxazol zinc complexes, benzothiazole zinc complexes, azomethyl zinc complexes, porphyrin zinc complexes, and europium complexes, and metal complexes comprising, for example, Al, Zn, or Be, or a rare earth metal such as Tb, Eu, or Dy as a central metal and, for example, an oxadiazole, thiadiazole, phenylpyridine, phenylbenzoimidazole, or quinoline structure as a ligand.

Specific examples thereof include tris(8-quinolinolate)aluminum complex (Alq$_3$), bis(2-methyl-8-quinolinolate)(p-phenylphenolate)aluminum complex (Alq$_3$), tri(dibenzoylmethyl)phenanthrolineeuropium complex, and bis(benzoquinolinolate)beryllium complex (BeBq). These materials may be used either solely or in a combination of two or more.

Further binder materials for the luminescent layer used as the host material for a polymer luminescent layer in organic EL devices include polymer luminescent materials, for example, compounds comprising the above low-molecular weight material introduced as a straight chain or a side chain or as a functional group into the molecule, polymers and dendrimers. Examples thereof include polyparaphenylene vinylene derivatives, polythiophene derivatives, polyparaphenylene derivatives, polysilane derivatives, polyacetylene derivatives, polyvinylcarbazole, polyfluorenone derivatives, polyfluorene derivatives, polyquinoxaline derivatives, polyaniline derivatives, and their copolymers.

Binder materials for the luminescent layer used as the electron transport material in organic EL devices include, for example, phthalocyanine derivatives, polythiophene derivatives, and porphyrin derivatives.

The moiety A in the binder component is a moiety that has a major influence on compatibility between the binder component in the luminescent layer and the QD protecting material, and the sum atomic weight MA of the atoms of the moiety A is more preferably not less than 150, particularly preferably not less than 200.

When the binder component is a polymer compound that contains two or more moieties A in one molecule of the binder component, for example, a polymer compound comprising repeating units, from the viewpoint of further improving the compatibility of the binder component in the luminescent layer with the QD protecting material, preferably, the sum of atomic weight of the atoms contained in the plurality of moieties A is larger than one-third, more preferably two-fifth, particularly preferably three-fifth, of the molecular weight of the binder component comprising the moiety A.

<Quantum Dots>

The quantum dots are semiconductor fine particles of nanometer size and exhibit specific optical and electrical properties by a quantum confinement effect (a quantum size effect) in which electrons or excitons are confined within small crystals of nanometer size and are called semiconductor nanoparticles or semiconductor nanocrystals.

Any material that is in the form of semiconductor fine particles of nanometer size and exhibit a quantum confinement effect (a quantum size effect) can be used as the quantum dots without particular limitation. For example, as described above, such quantum dots include semiconductor fine particles of which the luminescent color can be regulated by the particle diameter of the semiconductor fine particles per se, and dopant-containing semiconductor fine particles.

The quantum dots may be formed of one type or two or more types of semiconductor compounds. For example, the quantum dots may have a core-shall structure comprising a core of a semiconductor compound and a shell of a semiconductor compound different from the semiconductor compound constituting the core. A typical example thereof comprises a core of CdSe, a ZnS shell provided on the outer periphery of the core, and a protecting material (sometimes referred to as a capping compound) provided on the outer periphery of the shell. When the particle diameter of the quantum dots is varied, light having a different color is emitted. For example, when the quantum dots consist of a core of CdSe only, the peak wavelengths of fluorescence spectra for particle diameters of 2.3 nm, 3.0 nm, 3.8 nm, and 4.6 nm are 528 nm, 570 nm, 592 nm, and 637 nm, respectively.

Specific examples of materials for constituting the core of quantum dots include semiconductor crystals containing semiconductor compounds or semiconductors, for example, group II-VI semiconductor compounds such as MgS, MgSe, MgTe, CaS, CaSe, CaTe, SrS, SrSe, SrTe, BaS, BaSe, BaTe, ZnS, ZnSe, ZnTe, CdS, CdSe, CdTe, HgS, HgSe, and HgTe, group III-V semiconductor compounds such as AlN, AlP, AlAs, AlSb, GaAs, GaP, GaN, GaSb, InN, InAs, InP, InSb, TiN, TiP, TiAs, and TiSb, and group IV semiconductors such as Si, Ge, and Pb. Further, semiconductor crystals containing semiconductor compounds containing three or more devices such as InGaP may also be used.

Semiconductor crystals comprising the semiconductor compound doped with a cation of a rare earth metal or a cation of a transition metal, for example, $Eu^{3+}$, $Tb^{3+}$, $Ag^+$, or $Cu^+$, may also be used as the quantum dots comprising dopant-containing semiconductor fine particles.

Among others, semiconductor crystals such as CdS, CdSe, CdTe, InP, and InGaP are suitable from the viewpoints of easiness of preparation, the controllability of the particle diameter which provides luminescence in a visible range, and fluorescence quantum yield.

Regarding the semiconductor for constituting the shell when core-shell quantum dots are used, the luminescence efficiency of the quantum dots can be enhanced by using a material having a higher band gap than the semiconductor compound constituting the core so that excitons are confined in the core.

Core-shell structures (core/shell) having a magnitude relationship of the band gaps include, for example, CdSe/ZnS, CdSe/ZnSe, CdSe/CdS, CdTe/CdS, InP/ZnS, Gap/ZnS, Si/ZnS, InN/GaN, InP/CdSSe, InP/ZnSeTe, InGaP/ZnSe, InGaP/ZnS, Si/AlP, InP/ZnSTe, InGaP/ZnSTe, and InGaP/ZnSSe.

The size of the quantum dots may be properly regulated depending upon the material for constituting the quantum dots to obtain light having a desired wavelength. The energy band gap of the quantum dots increases with reducing the particle diameter of the quantum dots. That is, as the crystal size decreases, the luminescence of the quantum dots shifts toward blue, that is, higher energy. Accordingly, the luminescence wavelength can be regulated over wavelength ranges of an ultraviolet range spectrum, a visible range spectrum, and an infrared range spectrum by varying the size of quantum dots.

In general, the particle diameter of the quantum dots is preferably in the range of 0.5 to 20 nm, particularly preferably in the range of 1 to 10 nm. When the size distribution of the quantum dots is narrower, a luminescent color having higher sharpness can be provided.

The shape of the quantum dots is not particularly limited, and the quantum dots may be in a spherical, rod, disk, or other form. When the quantum dots are not spherical, the particle diameter of the quantum dots may be assumed to be the particle diameter of spheres having the same volume as the non-spherical quantum dots.

Information about the particle diameter, shape, dispersed state and the like of the quantum dots can be obtained with a transmission electron microscope (TEM). Further, the crystal structure and particle diameter of the quantum dots can be learned from X-ray crystal diffraction (XRD). Further, the particle diameter of the quantum dots and information about the surface of the quantum dots can also be obtained by an ultraviolet-visible (UV-Vis) absorption spectrum.

<QD Protecting Material>

In the present invention, the QD protecting material that protects the quantum dots comprises, as a part of its chemical structure, a linking group that develops the function of linking with QD, and a moiety B having a sum atomic weight MB of not less than 100 which is larger than one-third of the molecular weight of the QD protecting material.

From the viewpoint of efficient protection of QD, QD is preferably protected with the QD protecting material by adding the QD protecting material to a dispersion liquid of QD protected by a conventional protecting material composed mainly of an alkyl chain such as TOPO, stirring the mixture for a given period of time to replace the protecting material composed mainly of the alkyl chain with the QD protecting material according to the present invention.

The moiety B is a moiety that, in the molecule of the QD protecting material, has a major influence on the compatibility between the binder component in the luminescent layer and the QD protecting material. The sum atomic weight MB of the atoms in the moiety B is preferably not less than 150, more preferably two-fifth or more of the molecular weight of the QD protecting material, particularly preferably third-fifth or more of the molecular weight of the QD protecting material.

The sum atomic weight MA of the atoms in the moiety A and the sum atomic weight MB of the atoms in the moiety B satisfy formula (I):

$$|MA-MB|/MB \le 2 \qquad \text{formula (I)}$$

Thus, the material of which the difference between MA and MB is small is used. The smaller the difference between MA and MB, the better the results. The value of |MA−MB|/MB is preferably one or less, more preferably 0.5 or less.

The material satisfies a relationship represented by formula (II):

$$|SA-SB| \le 2 \qquad \text{formula (II)}$$

wherein SA represents the solubility parameter of the moiety A; and SB represents the solubility parameter of the moiety B.

The difference between SA and SB is preferably 1 or less, more preferably 0.5 or less.

The solubility parameter (hereinafter sometimes referred to as SP value) is an index that shows compatibility or incompatibility between substances and is correlated with the polarity of the groups in the molecule. When the difference in SP value between two substances in contact with each other is small, the difference in polarity between the two molecules is also small. In this case, the cohesive forces of the respective substances are close to each other. Accordingly, the compatibility and solubility are so large that the substances are easily soluble and can realize stable intimate contact of the interface, that is, stable contact surface. On the other hand, when the difference in SP value is large, the difference in cohesive force between the two substances is also large. In this case, the compatibility and solubility are so low that the substances are sparingly soluble or insoluble, the dispersibility of the two substances is poor, and the interface changes so as to reduce the contact area between the two substances.

There are several SP value measuring methods and calculation methods. In the present invention, the SP value is determined by the Bicerrano's method [Prediction of polymer properties, Marcel Dekker Inc., New York (1993)]. According to the Bicerrano's method, the solubility parameters of polymers are determined by an atomic group contribution method.

When the solubility parameter cannot be determined according to this literature, a method described in other known literature, for example, Fedors's method [Fedors, R. F., Polymer Eng. Sci., 14, 147 (1974)] or Askadskii's method [A. A. Askadaskii et al., Vysokomol. Soyed., A19, 1004 (1977).], may be used. According to the Fedors's method, the solubility parameters of polymers are determined by an atomic group contribution method. The atomic group contribution method is a method in which a molecule is divided into a few atomic groups to which experience parameters are allocated to determine the properties of the whole molecule.

The solubility parameter $\delta$ of a molecule is defined by the following equation:

$$\delta = (\delta_d^2 + \delta_p^2 + \delta_h^2)^{1/2}$$

Wherein $\delta_d$ represents a London dispersion force term; $\delta_p$ represents a molecular polarization term; and $\delta_h$ represents a hydrogen bond term. Each term is calculated by the following equation using molecular attraction force multipliers ($F_di$, $F_pi$, $E_hi$) for each term and molecular volume Vi in the constituent atomic group i in the molecule.

$$\delta_d^2 = \Sigma F_d i / \Sigma Vi$$

$$\delta_p^2 = (\Sigma F_p i^2)^{1/2} / \Sigma Vi$$

$$\delta_h^2 = (\Sigma E_h i / \Sigma Vi)^{1/2}$$

Numerical values described in a three-dimensional solubility parameter calculation table in Table 1 are used as the Molecular attraction force multipliers ($F_di$, $F_pi$, $E_hi$) for each term and molecular volume Vi in the constituent atomic group i in the molecule. Regarding the atomic groups not described in this table, values established by van Krevelen (the following documents A and B) were used for the molecular attraction force multipliers ($F_di$, $F_pi$, $E_hi$) for each term, and values established by Fedors (document C) were used for the molecular volume Vi.

TABLE 1

| Structural group | Fdi | Fpi | Ehi | Vi |
|---|---|---|---|---|
| —CH3 | 420 | 0 | 0 | 31.7 |
| —CH2— | 270 | 0 | 0 | 16.1 |
| >CH— | 80 | 0 | 0 | −1.0 |
| >C< | −70 | 0 | 0 | −19.2 |
| =CH2 | 403 | 94 | 143 | 28.5 |
| =CH— | 223 | 70 | 143 | 13.5 |
| =C< | 70 | 0 | 0 | −5.5 |
| —C6H11 | 1620 | 0 | 0 | 95.5 |
| —C6H5 | 1499 | 110 | 205 | 75.4 |
| —C6H4 (o, m, p) | 1319 | 110 | 205 | 60.4 |
| —F | 221 | 542 | — | 18.0 |
| —F (disubstituted, >CF2) | 221 | 542 | — | 20.0 |
| —F (trisubstituted, —CF3) | 221 | 542 | — | 22.0 |
| —Cl | 450 | 550 | 400 | 24.0 |
| —Cl (disubstituted, >CCl2) | 450 | 550 | 400 | 26.0 |
| —Cl (trisubstituted, —CCl3) | 450 | 550 | 400 | 27.3 |
| —Br | 550 | 614 | 1023 | 29.0 |
| —Br (disubstituted, >CBr2) | 550 | 614 | 1023 | 31.0 |
| —Br (trisubstituted, —CBr3) | 550 | 614 | 1023 | 32.0 |
| —I | 655 | 655 | 2046 | 32.2 |
| —CN | 430 | 1100 | 2500 | 24.0 |
| —OH | 210 | 500 | 20000 | 10.0 |
| —OH (disubstituted or on adjacent carbon) | 210 | 500 | 20000 | 13.0 |
| —O— | 235 | 409 | 2352 | 3.8 |
| —COH (aldehyde) | 470 | 800 | 4500 | 22.3 |
| >C=O | 290 | 770 | 2000 | 10.5 |
| —COOH | 530 | 420 | 10000 | 28.5 |
| —COO— (ester) | 390 | 490 | 7000 | 18.0 |
| HCOO— (formate) | 530 | — | — | 32.5 |
| —CO—O—CO— (anhydride) | 675 | 1105 | 4838 | 30.0 |
| —NH2 | 280 | 419 | 8400 | 17.9 |
| —NH— | 160 | 210 | 3100 | 4.5 |
| >N— | 20 | 800 | 5000 | −9.0 |
| —NO2 (aliphatic) | 500 | 1070 | 1500 | 24.0 |
| —NO2 (aromatic) | 500 | 1070 | 1500 | 32.0 |
| Si—O— | 266 | 307 | 921 | 3.8 |
| —S— (sulfide) | 440 | — | — | 12.0 |
| =PO4— (phosphate) | 740 | 1890 | 6352 | 28.0 |
| Ring (five- or higher membered ring) | 190 | — | — | 13.5 |
| Ring (three-, four- or higher membered ring) | 190 | — | — | 18.0 |

Document A: K. E. Meusburger: "Pesticide Formulations: Innovations and Developments" Chapter 14 (Am. Chem. Soc.), 151-162 (1988)

Document B: A. F. M. Barton: "Handbook of Solubility Parameters and Other Cohesion Parameters" (CRC Press Inc., Boca Raton, Fla.) (1983)

Document C: R. F. Fedors: Polymer Eng. Sci., 14, (2), 147-154 (1974)

A method which comprises heating a mixed thin film and observing a change in surface morphology may be mentioned as a method for experimentally evaluating the aggregation stability of the mixed thin film. This method undergoes an influence of matching of SP value with the substrate or air interface and involves the difficulties of realizing quantification. Accordingly, the above method utilizing the calculation is preferred as the method for evaluating the stability of the mixed thin film.

The difference in SP value between the moiety A in the compound contained in the luminescent layer and the moiety B in the QD protecting material is small as described in formula (II). Accordingly, the compatibility between the binder component in the luminescent layer and the QD protecting material is so high that, in the film formation, QD protected by the QD protecting material is homogeneously dispersed in the luminescent layer, whereby the light emitting device according to the present invention does not cause QD aggregation and can realize prolonged drive lifetime.

In the present invention, the use of a QD protecting material not containing the linking group has a possibility of causing a shortened lifetime of the device when the sum atomic weight MA of the atoms contained in the moiety A is less than 100; when the sum atomic weight MB of the atoms contained in the moiety B is less than 100; when MA and MB do not satisfy formula (I); when MB is one-third or less of the molecular weight of the QD protecting material; and/or when SA and SB do not satisfy formula (II). The reason for this is believed to reside in that the drive of the light emitting device for a long period of time causes aggregation between QDs and phase separation, resulting in lowered properties of the light emitting device such as lowered color purity and luminescence current efficiency.

Any compound contained in the luminescent layer and any QD protecting material according to the present invention that satisfy the requirements of the present invention can be used, and proper compound and QD protecting material can be specified. Among others, a carrier transport group is preferred.

Preferably, the QD protecting material has a structure represented by chemical formula (1):

X—Y        (1)

wherein X represents a moiety that contains the moiety B and ensures the stability of adhesion to the binder component in the luminescent layer; and Y represents a linking group linked to QD.

In the chemical formula (1), the moiety B contained in X improves the stability of adhesion to the binder component in the luminescent layer.

On the other hand, Y represents a linking group linkable to QD. The number of linking groups contained in one molecule of the QD protecting material may be one or more without particular limitation. When the number of linking groups is two or more per molecule, however, there is a possibility that the QD protecting materials are polymerized with each other and the linking group moiety having poor compatibility with the binder component in the luminescent layer is exposed on the binder component side to inhibit the compatibility between the binder component and the QD protecting material. Accordingly, the number of linking groups is preferably one per molecule of the QD protecting material. When the number of linking groups is one per molecule, the QD protecting material is bonded to QD or forms a dimer through a reaction of two molecules of the QD protecting material to stop the reaction. The dimer has low adhesion to QD and thus can easily be removed from within the film by carrying out a washing-out step.

The linking group Y is preferably a group containing at least an oxygen atom (O) and a halogen atom, a group containing at least a nitrogen atom (N), or a group containing at least a sulfur atom (S), and a group selected from groups represented by the following formulae (Y-1 to Y-9) may be mentioned as a specific example of the linking group Y.

[Chemical formula 4]

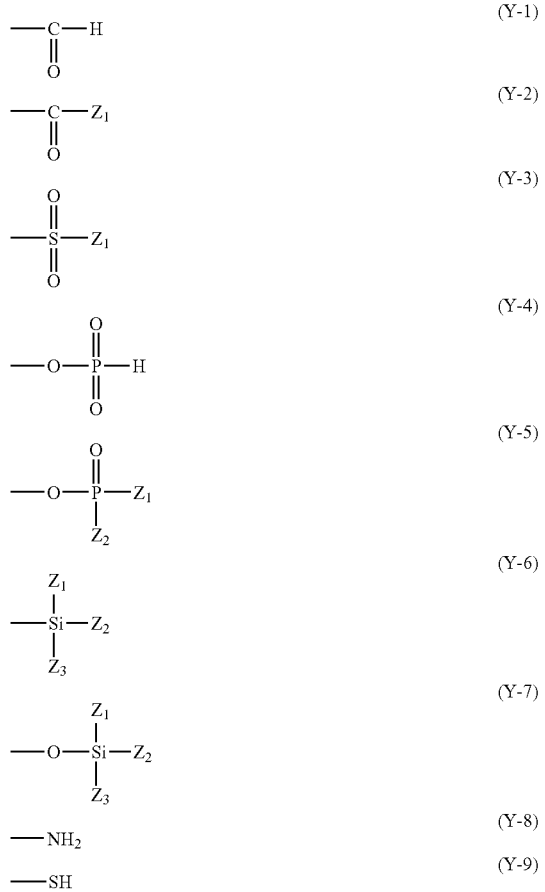

In the formulae (Y-1 to Y-9), preferably, $Z_1$, $Z_2$, and $Z_3$ each independently represent a halogen atom or an alkoxy group, particularly preferably a chlorine atom, a methoxy group, or an ethoxy group. These linking groups Y is generally linked to a reactive functional group (a hydroxyl group in many cases) present on the surface of QD and thus is bonded to the surface of QD. The linking group Y is particularly preferably a phosphoric acid chloride group ($-OP(O)Cl_2$), a primary amino group ($-NH_2$), or a mercapto group ($-SH$) from the viewpoints of improved adhesion stability to improve the shortened lifetime of the device.

Further, the phosphoric acid chloride group ($-OP(O)Cl_2$) is highly reactive, functions as an oxidizing agent for the aromatic tertiary amine, and can form a charge transfer complex (CT complex) with the binder component to control the injection and transfer of the charges and thus is preferred from the viewpoint of controlling the carrier balance to improve luminescence characteristics. Further, the reactivity is so high that, when the defective part of the protecting material such as TOPO covering the periphery of the QD material is compensated or is replaced, there is no need to use a large excess amount of the protecting material, whereby the utilization efficiency of the material is advantageously high. Further, the reactivity is so high that the surface of the QD material can be more strongly and stably protected and, consequently, high drive stability can be advantageously realized. Further, since the luminescent layer can be insolubilized, the luminescent layer according to the present invention can be stacked by a coating method. The coating method is advantageously a simple production process and can reduce the production cost.

On the other hand, the primary amino group ($-NH_2$) and the mercapto group ($-SH$) have lower reactivity than the phosphoric acid chloride group ($-OP(O)Cl_2$). Since, however, an unshared electron pair on a nitrogen or sulfur atom, or a anion produced by deprotonation is in many cases utilized for the interaction with the surface of QD, by-products such as halogen anions do not occur. Accordingly, the primary amino group ($-NH_2$) and the mercapto group ($-SH$) are also preferred from the viewpoint of reducing the amount of impurities within the luminescent layer and, consequently, realizing high drive stability.

Thus, the linking group Y is linked to QD through a chemical bond such as an ion band or a covalent bond. Accordingly, when the moiety B in the QD protecting material or the QD protecting material has the structure represented by chemical formula (1), it is considered that the part X is arranged so as to face the direction of the binder component in the luminescent layer. Since the moiety B satisfies the relationship represented by formulae (I) and (II), QD protected by the protecting material according to the present invention has high compatibility with the binder component in the luminescent layer and, thus, in the film formation, is homogeneously dispersed in the luminescent layer.

The moiety A in the binder component in the luminescent layer preferably has the same skeleton as the moiety B in the QD protecting material or has a skeleton similar to the moiety B in the QD protecting material, specifically the same skeleton as the moiety B in the QD protecting material except that a spacer structure is further contained in the skeleton, from the viewpoints of reducing the difference between SA and SB represented by formula (II), improving the compatibility between the binder component in the luminescent layer and the QD protecting material, dispersing the QD protected by the QD protecting material homogeneously in the luminescent layer, and making a contribution to prolonged drive lifetime.

The skeleton refers to a structure after removing substituents from the moiety A or B. The expression "spacer structure is contained" means the presence of an atom that extends the skeleton. The atom that extends the skeleton is preferably a hydrocarbon structure having 1 to 12 carbon atoms. However, other atoms such as an ether bond may also be contained.

Specific examples of the skeleton common to the moiety A and the moiety B include triphenylamine, fluorene, biphenyl, pyrene, anthracene, carbazole, phenylpyridine, trithiophene, phenyloxadiazole, phenyltriazole, benzimidazole, phenyltriazine, benzodiathiazine, phenylquinoxaline, phenylenevinylene, and phenylsilole skeletons, and a skeleton comprising a combination of these skeletons.

The moiety A and the moiety B may be different from each other in the type, number, and position of substituents on the skeleton as long as the moiety A and the moiety B are identical or similar to each other in skeleton. When a substituent is present on the skeleton, the substituent is preferably, for example, a straight chain or branched alkyl group having 1 to 20 carbon atoms. More preferred are straight chain or branched alkyl groups having 1 to 12 carbon atoms, for example, methyl, ethyl, propyl, isopropyl, butyl, isobutyl, sec-butyl, tert-butyl, pentyl, hexyl, heptyl, octyl, nonyl, decyl, undecyl, and dodecyl groups.

In the luminescent layer, two or more types of moiety A may be contained in one molecule in the compound, and two or more types of moiety B may be contained in one molecule in the QD material. In this case, the proportion of the common part in the whole luminescent layer is large, that is, the difference between SA and SB represented by formula (II) is small, and, thus, the compatibility between the binder component and the QD protecting material in the luminescent layer can be improved.

When a polymer compound comprising a single type or a plurality of types of repeating units is used as the compound contained in the luminescent layer, in general, a single type or a plurality of types of the repeating units is selected as the moiety A while a material containing a moiety B having the same skeleton as the moiety A or having a skeleton similar to the moiety A, specifically the same skeleton as the moiety A except that a spacer structure is further contained in the skeleton, is used as the QD material.

When the binder component in the luminescent layer is a compound represented by chemical formula (2), the use of a compound represented by chemical formula (3) as the QD protecting material is preferred from the viewpoint of improving the adhesion stability derived from the common structure.

[Chemical formula 5]

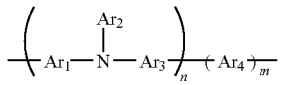

Chemical formula (2)

wherein $Ar_1$ to $Ar_4$, which may be the same or different, represent an unsubstituted or substituted aromatic hydrocarbon group having 6 to 60 carbon atoms involved in a conjugated bond, or an unsubstituted or substituted heterocyclic group having 4 to 60 carbon atoms involved in a conjugated bond; n is 0 to 10000 and m is 0 to 10000, provided that n+m=1 to 20000 (at least one of the two types of repeating units is present); the two repeating units are arranged in any order; when two or more repeating units represented by the repeating unit —($Ar_1$(—$Ar_2$)—$Ar_3$)— are present in an identical molecule, they may be the same or different; and, when two or more repeating units represented by —($Ar_4$)— are present in an identical molecule, they may be the same or different

[Chemical formula 6]

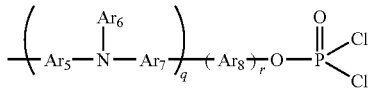

Chemical formula (3)

wherein —$Ar_5$ to $Ar_8$, which may be the same or different, represent an unsubstituted or substituted aromatic hydrocarbon group having 6 to 60 carbon atoms involved in a conjugated bond, or an unsubstituted or substituted heterocyclic group having 4 to 60 carbon atoms involved in a conjugated bond; q is 0 to 10 and r is 0 to 10, provided that q+r=1 to 20 (at least one of the two types of repeating units is present); the two repeating units are arranged in any order; the linking group —O—P(=O)Cl$_2$ may be linked to a repeating unit —($Ar_8$)— or may be linked to another repeating unit —($Ar_5$(—$Ar_6$)—$Ar_7$)—; when two or more repeating units represented by the repeating unit —($Ar_5$(—$Ar_6$)—$Ar_7$)— are present in an identical molecule, they may be the same or different; and, when two or more repeating units represented by —($Ar_8$)— are present in an identical molecule, they may be the same or different.

in the formulae $Ar_1$ to $Ar_4$ and $Ar_5$ to $Ar_8$, specific examples of the aromatic hydrocarbon in the aromatic hydrocarbon group include benzene, fluorine, naphthalene, anthracene, a combination of the above aromatic hydrocarbons, derivatives of the above aromatic hydrocarbons, and, further, phenylenevinylene derivatives and styryl derivatives. Further, specific examples of the heterocylic ring in the heterocyclic group include thiophene, pyridine, pyrrole, carbazole, a combination of the above heterocyclic rings, and derivatives of the above heterocyclic rings.

In chemical formulae (2) and (3), the combination of $Ar_1$, $Ar_2$, and $Ar_3$ is preferably identical to the combination of $Ar_5$, $Ar_6$, and $Ar_7$ in at least the skeleton of the aromatic hydrocarbon group or the heterocyclic group. Further, $Ar_4$ in chemical formula (2) is also preferably identical to $Ar_8$ in chemical formula (3) in at least the skeleton of the aromatic hydrocarbon group or the heterocyclic group.

When $Ar_1$ to $Ar_4$ in chemical formula (2) have a substituent, the substituent preferably is, for example, a straight chain or branched alkyl group or alkenyl group having 1 to 12 carbon atoms, for example, a methyl, ethyl, propyl, isopropyl, butyl, isobutyl, sec-butyl, tert-butyl, pentyl, hexyl, heptyl, octyl, nonyl, decyl, undecyl, dodecyl, vinyl, or allyl group.

When $Ar_5$ to $Ar_8$ in chemical formula (3) have a substituent, the substituent is, for example, a straight chain or branched alkyl group having 1 to 12 carbon atoms, or a monovalent or divalent group obtained by removing hydrogen from one or two carbon positions of an aromatic hydrocarbon or heterocyclic ring such as a fluorene, biphenyl, pyrene, anthracene, carbazole, phenylpyridine, trithiophene, phenyloxadiazole, phenyltriazole, benzimidazole, phenyltriazine, benzodiathiazine, phenylquinoxaline, phenylenevinylene, or phenylsilole skeleton. The monovalent or divalent group obtained by removing hydrogen from one or two carbon positions of the aromatic hydrocarbon or heterocyclic ring may further have a substituent such as an alkyl group.

Chemical formulae (4a) and (4b) may be mentioned as typical examples of chemical formula (3).

[Chemical formula 7]

Chemical formula (4a)

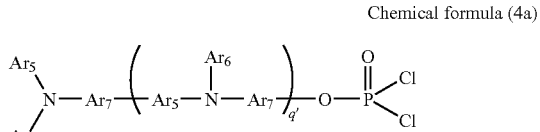

Chemical formula (4b)

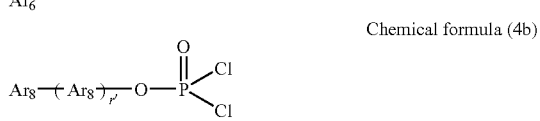

In chemical formula (4a), $Ar_5$ to $Ar_7$, which may be the same or different, represent an unsubstituted or substituted aromatic hydrocarbon group having 6 to 60 carbon atoms involved in a conjugated bond, or an unsubstituted or substituted heterocyclic group having 4 to 60 carbon atoms involved in a conjugated bond; q' is 0 to 9; when two or more repeating units represented by (Ar$_5$(—Ar$_6$)—Ar$_7$)— or —(Ar$_5$(—Ar$_6$)—Ar$_7$)— are present in an identical molecule, they may be the same or different.

In chemical formula (4b), Ar$_8$, which may be the same or different, represent an unsubstituted or substituted aromatic hydrocarbon group having 6 to 60 carbon atoms involved in a conjugated bond, or an unsubstituted or substituted heterocyclic group having 4 to 60 carbon atoms involved in a conjugated bond; r' is 0 to 9; when two or more repeating units represented by (Ar$_8$)— or —(Ar$_8$)— are present in an identical molecule, they may be the same or different.

Specifically, when the compound represented by chemical formula (2) is poly[(9,9-dioctylfluorenyl-2,7-diyl)-co-(4,4'-(N-(4-sec-butylphenyl))diphenylamine)] (TFB) represented by formula (5), the use of diphenylaminophenylphosphoric acid dichlorophosphodate (TPA-O—P(O)Cl$_2$) represented by formula (6) or compounds represented by formulae (7) to (10) as the QD protecting material is advantageous in that the interface of the QD protecting material and QD can be particularly stabilized to improve the compatibility between the QD protected by the QD protecting material and the binder component in the luminescent layer, and the interface of the QD protecting material and the binder component in the luminescent layer can be particularly stabilized to maintain the stability of adhesion between the QD protecting material and the binder component in the luminescent layer, significantly contributing to the drive stability and prolonged drive lifetime of the light emitting device. Rs each independently represent a group selected from the group consisting of a hydrogen atom, an alkyl group having 1 to 20 carbon atoms, an alkoxy group having 1 to 20 carbon atoms, an aryl group having 6 to 60 carbon atoms, an aryloxy group having 6 to 60 carbon atoms, an arylalkyl group having 7 to 60 carbon atoms, an arylalkoxy group having 7 to 60 carbon atoms, a heterocyclic group having 4 to 60 carbon atoms, a cyano group, a nitro group, and a halogen atom.

[Chemical formula 8]

Chemical formula (5)

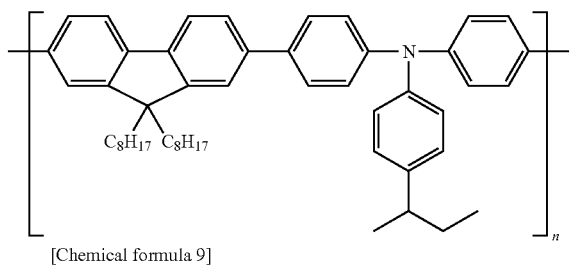

[Chemical formula 9]

Chemical formula (6)

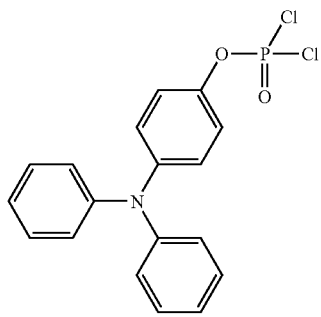 [SMILES: O=P(Cl)(Cl)Oc1ccc(N(c2ccccc2)c2ccccc2)cc1]

[Chemical formula 10]

Chemical formula (7)

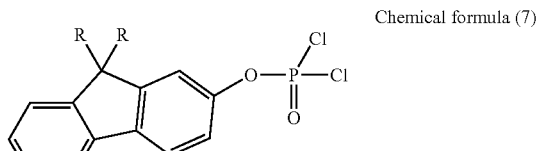

[Chemical formula 11]

Chemical formula (8)

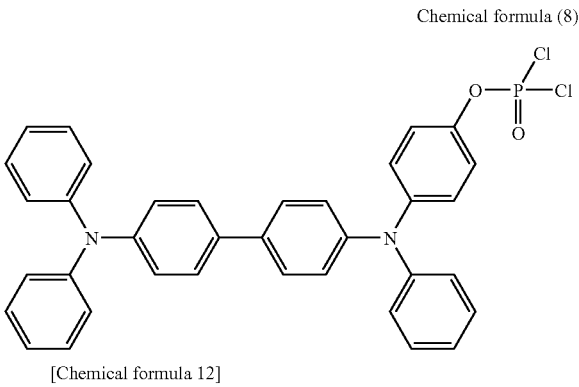

[Chemical formula 12]

Chemical formula (9)

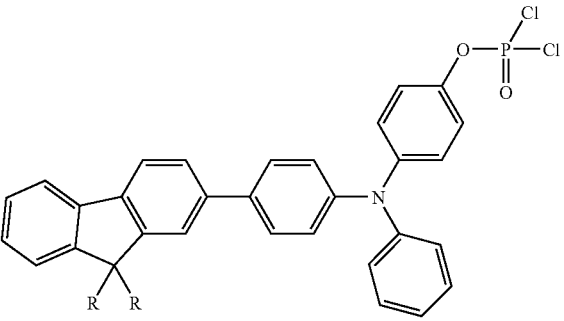

[Chemical formula 13]

Chemical formula (10)

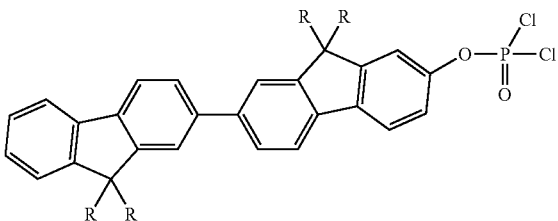

Further, for example, when PVK (polyvinyl carbazole) is used as the binder component in the luminescent layer, compounds represented by chemical formulae (11) to (13) are suitable as the QD protecting material. Rs each independently represent a group selected from the group consisting of a hydrogen atom, an alkyl group having 1 to 20 carbon atoms, an alkoxy group having 1 to 20 carbon atoms, an aryl group having 6 to 60 carbon atoms, an aryloxy group having 6 to 60 carbon atoms, an arylalkyl group having 7 to 60 carbon atoms, an arylalkoxy group having 7 to 60 carbon atoms, a heterocyclic group having 4 to 60 carbon atoms, a cyano group, a nitro group, and a halogen atom.

[Chemical formula 14]

Chemical formula (11)

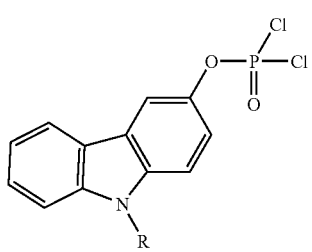

[Chemical formula 15]

Chemical formula (12)

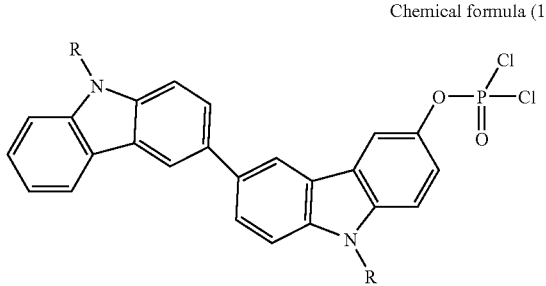

[Chemical formula 16]

Chemical formula (13)

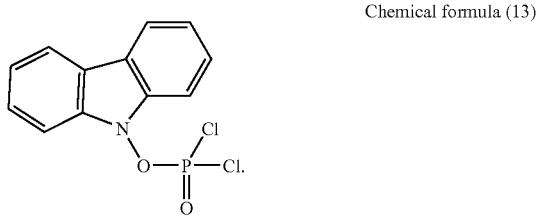

The mixing ratio between the organic binder material and the quantum dots may be properly regulated depending upon the type of the material used. In general, the luminescent material has hitherto been mixed at a weight ratio of approximately 1 to 20 parts by weight to 100 parts by weight of the binder material. In the present invention, the mixing of the quantum dots as the luminescent material in a relatively larger amount of the binder material used is preferred because better properties, for example, in terms of adhesion stability of the length scale of the molecular size (nm order) and current efficiency can be provided. The mixing ratio of the luminescent material to the binder material can be increased to such an extent that the binding action of the binder material is substantially satisfactory in practical use.

More specifically, preferably, the mixing ratio of quantum dots protected by the protecting material to 100 parts by weight of the binder material can be brought to not less than 30 parts by weight, more preferably not less than 50 parts by weight, still more preferably not less than 80 parts by weight. Further, regarding the upper limit of the mixing ratio of the luminescent material to the binder material, in general, the mixing ratio up to 200 parts by weight can satisfactorily ensure the binding action of the binder material and the upper limit of the mixing ratio is preferably not more than 170 parts by weight.

<Organic Luminescent Material>

Dopant materials for a luminescent layer commonly used in organic EL devices can be used as the organic luminescent material. Such dopant materials include, for example, perylene derivatives, coumarin derivatives, rubrene derivatives, quinacridone derivatives, squalium derivatives, porphyrin derivatives, styryl coloring matters, tetracene derivatives, pyrazoline derivatives, decacyclene derivatives, phenoxazone derivatives, quinoxaline derivatives, carbazole derivatives, and fluorene derivatives. Further, compounds obtained by introducing a Spiro group into these derivatives may also be used. Specific examples thereof include 1-tert-butylperylene (TBP), coumarin 6, Nile Red, 1,4-bis(2,2-diphenylvinyl)benzene (DPVBi), and 1,1,4,4-tetraphenyl-1,3-butadiene (TPB). These materials may be used either solely or in a combination of two or more.

Organic metal complexes that have a heavy metal ion such as a platinum or iridium ion at the center and exhibit phosphorescence can be used as phosphorescent dopants. Specific examples thereof include tris(2-phenyl pyridine)iridium(III) complex (Ir(ppy)$_3$), bis(2-phenylpyridine)(acetylacetonate) iridium(III) complex ((ppy)$_2$Ir(acac)), tris(1-phenylisoquinoline)iridium(III) complex (Ir(piq)$_3$), bis(48,68-difluorophenylpyridinate)tetrakis(1-pyrazolyl)borate, and iridium(III) complex (FIr$_6$). These materials may be used either solely or in a combination of two or more.

In the case of a polymer dopant material, the organic metal complex can be contained as a luminescent group in the molecular structure.

<Other Materials for Luminescent Layer>

The luminescent layer may optionally contain binder resins and curable resins other than the compounds containing the moiety A, for example, from the viewpoint of reinforcing the layer strength and may contain further additives such as coatability improvers. Binder resins include, for example, polycarbonate, polystyrene, polyarylate, and polyester. Binder resins curable, for example, by heat or light may also be contained. The use of these resins, when the coating solution for luminescent layer formation is coated, can reduce the elution of constituents of the luminescent layer into an underlying layer onto which the coating solution is coated, for example, the elution of the constituents of the hole transport layer in the case of the organic EL device. The materials curable by heat, light or the like usable herein include the same materials as described above in connection with the materials for the luminescent layer except that a curable functional group has been introduced into the molecule, or curable resins. Specific examples of such curable functional groups include acrylic functional groups such as acryloyl and methacryloyl groups, or vinylene, epoxy, and isocyanate groups. The curable resins may be a heat curable resin or a photocurable resin. Examples thereof include epoxy resins, phenolic resins, melamine resins, polyester resins, polyurethane resins, silicon resins, and silane coupling agents. When the curable resin is used, a dispersion of the QD material and the following organic luminescent material in the curable resin as the binder can be used as the luminescent layer.

The thickness of the luminescent layer is preferably 0.1 to 1000 nm, particularly preferably 10 to 100 nm, from the viewpoint of suppressing pinhole defects of the luminescent layer while lowering the drive voltage.

The luminescent layer may be formed by a solution coating method or a transfer method using the luminescent material.

The luminescent layer is preferably formed by the solution coating method from the viewpoints of a simple production process and a lowered production cost. The solution coating method is a method that comprises adding one or at least two main materials for luminescent layer formation (the binder component and QD protected by the QD protecting material, for example, in the case of the organic EL device) and optionally a resin that is a binder component which does not function as a trap for holes, and a coatability improver or other additives, dissolving the ingredients into each other to prepare a coating solution, coating the coating solution onto the hole injection electrode or the hole transport layer to form a coating, and drying the coating to form the luminescent layer.

Solution coating methods include, for example, dipping, spray coating, nozzle jet coating, ink jet coating, spin coating, blade coating, dip coating, cast coating, roll coating, bar coating, and die coating. Dipping and dip coating are suitable when the formation of a monomolecular film is contemplated.

The transfer method is a method that comprises laminating the luminescent layer previously formed, for example, by a solution coating method or a vapor deposition method on a film onto a hole transport layer provided on an electrode, and transferring the luminescent layer onto the hole transport layer by heating. Alternatively, a method may also be adopted which comprises providing a laminate comprising a film, a luminescent layer, and a hole transport layer stacked in that order and transferring the laminate onto an electrode so that the hole transport layer faces the electrode.

The present invention is characterized in that the luminescent layer is formed by a wet coating method. Accordingly, when the luminescent layer is formed by a coating process, the process cost can be advantageously lowered.

<Substrate>

The substrate functions as a support in the light emitting device according to the present invention and may be formed of, for example, a flexible material or a hard material. Specific examples of materials usable herein include glass, quartz, polyethylene, polypropylene, polyethylene terephthalate, polymethacrylate, polymethylmethacrylate, polymethylacrylate, polyester, and polycarbonate.

When a synthetic resin substrate among these substrates is used, preferably, the synthetic resin substrate has gas barrier properties. The thickness of the substrate is not particularly limited, but is generally approximately 0.5 to 2.0 mm.

<Electrode>

The light emitting device according to the present invention comprises two or more opposed electrodes provided on a substrate.

In the light emitting device according to the present invention, the electrodes are preferably formed of a metal or a metal oxide, and examples of such materials include platinum, gold, silver, nickel, chromium, copper, iron, tin, antimony lead, tantalum, indium, palladium, tellurium, rhenium, iridium, aluminum, ruthenium, germanium, molybdenum, tungsten, tin antimony oxide, indium tin oxide (ITO), fluorine-doped zinc oxide, zinc, carbon, graphite, glassy carbon, silver paste and carbon paste, lithium, beryllium, sodium, magnesium, potassium, calcium, scandium, titanium, manganese, zirconium, gallium, niobium, sodium, sodium-potassium alloy, magnesium, lithium, aluminum, magnesium/copper mixture, magnesium/silver mixture, magnesium/aluminum mixture, magnesium/indium mixture, aluminum/aluminum oxide mixture, and lithium/aluminum mixture. In general, the electrodes may be formed of a metal such as aluminum, gold, silver, nickel, palladium, or platinum or a metal oxide such as an oxide of indium and/or tin.

The electrodes are in many cases formed on the substrate by a method such as a sputtering method or a vacuum deposition method. Alternatively, the electrodes may be formed by a wet method such as a coating method or a dipping method. The thickness of the electrodes varies depending, for example, upon the transparency required of the electrodes. When the electrodes should be transparent, the light transmittance of a visible light wavelength range in the electrodes is generally not less than 60%, preferably not less than 80%. In this case, the thickness is generally 10 to 1000 nm, preferably approximately 20 to 500 nm.

A metal layer may be further provided on the electrodes. The metal layer refers to a metal-containing layer and is formed of a metal or a metal oxide commonly used in electrodes.

<Others>

The light emitting device according to the present invention may optionally comprise conventional electron injection layer and/or electron transfer layer between the electron injection electrode and the luminescent layer.

Further, if necessary, conventional hole injection layer and/or hole transport layer may be properly provided between the hole injection electrode and the luminescent layer.

Conventional inorganic fluorescent materials, conventional organic light emitting materials known, for example, in organic EL devices, and charge transport materials may be used in the luminescent layer according to the present invention as long as the use of these materials is not deviated from the subject matter of the present invention. The luminescent layer is formed as a mixed film composed of an organic binder material that forms the moiety A and an inorganic luminescent material or an organic luminescent material.

EXAMPLES

The present invention is further illustrated by the following Examples that are not intended as a limitation of the invention. In the following Examples, "parts" are by weight unless otherwise specified.

In the Examples, the evaluation was carried out by the following methods.

(1) Measurement of Layer Thickness

Unless otherwise specified, the thickness of each layer described in the present invention was determined by forming each layer in a single layer form onto a cleaned glass substrate with ITO (manufactured by Sanyo Vacuum Industries Co., Ltd.) and measuring the formed difference of level. The thickness of the layer was measured with a probe microscope (Nanopics1000 manufactured by SII NanoTechnology Inc.).

(2) Current Efficiency and Power Efficiency of Organic EL Device

For the organic EL devices produced in the Examples, the current efficiency and power efficiency were calculated by current-voltage-brightness (I-V-L) measurement, The I-V-L measurement was carried out by grounding the cathode, applying a positive direct current voltage to the anode while scanning (1 sec./div.) at intervals of 100 mV, recording the current and brightness at each voltage. The brightness was measured with a luminance meter BM-8 manufactured by TOPCON CORPORATION. Based on the results, the luminescence efficiency (cd/A) was calculated from the luminescent area, the current, and the brightness.

(3) Measurement of Chromaticity

The chromaticity was evaluated by ΔE94 color difference formula (CIE 1994). The chromaticity was determined by measuring a luminescence spectrum of an organic EL device with a spectroradiometer SR-2 manufactured by TOPCON CORPORATION and calculating the chromaticity with the above device.

(4) Measurement of Fluorescence Spectrum

The fluorescence spectrum was measured with a fluorescence spectrophotofluometer F-4500 manufactured by Hitachi. A film having a single-layer structure was formed from a material, to be measured, on glass and measuring a fluorescence spectrum obtained at an excitation light wavelength of 360 nm with a spectrophotofluometer. The fluorescence spectrum was utilized for determination of EL luminescent spectrum components.

The structure of binders 1 to 4 and the structure of protecting groups 1 to 7 used in the following Examples and Comparative Examples are shown in Table 2.

Example 1

ITO/hole injection layer/hole transport layer/quantum dot-containing luminescent layer/hole block layer/electron transport layer/electron injection layer/cathode A transparent anode, a hole injection layer, a hole transport layer, a quantum dot-containing luminescent layer, a hole block layer, an electron transport layer, an electron injection layer, and a cathode were formed and stacked in that order on a glass substrate, and the assembly was finally sealed to produce an organic EL device. All of works except for a transparent anode and a hole injection layer were carried out within a glove box of which the atmosphere was replaced by nitrogen (moisture concentration and oxygen concentration in glove box: not more than 0.1 ppm and not more than 0.1 ppm, respectively).

At the outset, a thin film (thickness: 150 nm) of indium tin oxide (ITO) was formed as a transparent anode. A glass substrate with ITO (manufactured by Sanyo Vacuum Industries Co., Ltd.) was patterned in a strip form. The patterned ITO substrate was ultrasonically cleaned with a neutral detergent and ultrapure water in that order and was subjected to UV ozone treatment.

A thin film (thickness: 20 nm) of poly(3,4-ethylenedioxythiophene)-polystyrene sulfonic acid (PEDOT-PSS) was formed as a hole injection layer on the cleaned anode. A PEDOT-PSS solution was spin coated in the air to form a coating. After the formation of the PEDOT-PSS film, the PEDOT-PSS film was dried on a hot plate in the air to evaporate moisture.

A thin film (thickness: 10 nm) of poly[(9,9-di-{5-pentenyl}-fluorenyl-2,7-diyl)-co-(4,4'-(N-(4-sec-butylphenyl))diphenylamine)] (TFB) was then formed as a hole transport layer by coating on the hole injection layer. This thin film was formed by spin-coating a coating solution prepared by dissolving TFB (manufactured by American Dye Source, Inc.) in toluene in the air. After the formation of the film, the film was dried on a hot plate at 200° C. for one hr in the air to evaporate toluene.

A mixed thin film (thickness: 20 nm) composed of TFB as a binder 1 and quantum dots (QD) as a luminescence center was formed as a quantum dot-containing luminescent layer by coating on the hole transport layer. This mixed thin film was formed by spin-coating a coating solution prepared by dissolving the binder 1 and the green light emitting QD at a mixing ratio of binder 1:green light emitting QD of 10:3 (weight ratio) in toluene in the air. The green light emitting QD was prepared using a material having a QD protecting group 1 (luminescence wavelength 530 nm, dispersed in toluene). After the formation of the mixed film, the film was dried on a hot plate in the air to evaporate toluene.

Bis(2-methyl-8-quinolilate)(p-phenylphenolate)aluminum complex (abbreviated to BAlq) (thickness: 60 nm) was then formed as a hole block layer on the organic luminescent layer. The hole block layer was formed by a resistance heating vapor deposition method in vacuo (pressure: $1\times10^{-4}$ Pa). A film of LiF (thickness: 0.5 nm) as an electron injection layer and a film of Al (thickness: 120 nm) as a cathode were formed in that order on the electron transport layer. The film was formed by a resistance heating vapor deposition method in vacuo (pressure: $1\times10^{-4}$ Pa). Finally, after the cathode formation, the assembly was sealed using an alkali-free glass and a UV curing-type epoxy adhesive within a glove box to prepare an organic EL device of Example 1.

Example 2

An organic EL device of Example 2 was produced in the same manner as in Example 1 (amount of binder 1:amount of green light emitting QD having a protecting group 2 (weight ratio)=10:3), except that the green light emitting QD constituting the quantum dot-containing luminescent layer was prepared using a material having a protecting group 2 (luminescence wavelength 530 nm, dispersed in toluene) instead of the material having a protecting group 1.

Example 3

An organic EL device of Example 3 was produced in the same manner as in Example 1 (amount of binder 1:amount of green light emitting QD having a protecting group 3 (weight ratio)=10:3), except that the green light emitting QD constituting the quantum dot-containing luminescent layer was prepared using a material having a protecting group 3 (luminescence wavelength 530 nm, dispersed in toluene) instead of the material having a protecting group 1.

Example 4

An organic EL device of Example 4 was produced in the same manner as in Example 1 (amount of binder 2:amount of green light emitting QD having a protecting group 1 (weight ratio)=10:3), except that the host material (binder component) constituting the quantum dot-containing luminescent layer was prepared using poly[(9,9-di-{5-pentenyl}-fluorenyl-2,7-diyl)] (abbreviated to PFO), which is a binder 2, instead of the TFB.

Example 5

An organic EL device of Example 5 was produced in the same manner as in Example 4 (amount of binder 2:amount of green light emitting QD having a protecting group 4 (weight ratio)=10:3), except that the green light emitting QD constituting the quantum dot-containing luminescent layer was prepared using a material having a protecting group 4 (luminescence wavelength 530 nm, dispersed in toluene) instead of the material having a protecting group 1.

Example 6

An organic EL device of Example 6 was produced in the same manner as in Example 1 (amount of binder 3:amount of green light emitting QD having a protecting group 1 (weight ratio)=10:3), except that the host material (binder component) constituting the quantum dot-containing luminescent layer was prepared using N,N'-bis-(3-methylphenyl)-N,N'-bis-(phenyl)-benzidine (TPD), which is a binder 3, instead of the TFB.

Example 7

An organic EL device of Example 7 was produced in the same manner as in Example 6 (amount of binder 3:amount of green light emitting QD having a protecting group 4 (weight ratio)=10:3), except that the green light emitting QD constituting the quantum dot-containing luminescent layer was prepared using a material having a protecting group 4 (luminescence wavelength 530 nm, dispersed in toluene) instead of the material having a protecting group 1.

Example 8

An organic EL device of Example 8 was produced in the same manner as in Example 1 (amount of binder 4:amount of green light emitting QD having a protecting group 1 (weight ratio)=10:3), except that the host material (binder component) constituting the quantum dot-containing luminescent layer was prepared using 2-methyl-9,10-di-2-naphthylanthracene (MADN), which is a binder 4, instead of the TFB.

Example 9

An organic EL device of Example 9 was produced in the same manner as in Example 8 (amount of binder 4:amount of green light emitting QD having a protecting group 5 (weight ratio)=10:3), except that the green light emitting QD constituting the quantum dot-containing luminescent layer was prepared using a material having a protecting group 5 (luminescence wavelength 530 nm, dispersed in toluene) instead of the material having a protecting group 1.

Example 10

An organic EL device of Example 10 was produced in the same manner as in Example 8, except that the quantum dot-containing luminescent layer was formed using a mixed thin film (thickness: 30 nm) containing 2,3,6,7-tetrahydro-1,1,7,7-tetramethyl-1H,5H,11H-10-(2-benzo thiazolyl)quinolizino-[9,9a,1gh]coumarin (abbreviated to C545T), which is a green organic fluorescent material, in addition to the binder 4 and the quantum dot material (QD). This mixed thin film was formed by spin-coating a coating solution prepared by dissolving the binder 4, the green light emitting QD, and C545T at a mixing ratio of binder 4:green light emitting QD:C545T of 20:6:1 (weight ratio) in toluene in the air. After the formation of the mixed film, the film was dried on a hot plate in the air to evaporate toluene.

Example 11

An organic EL device of Example 11 was produced in the same manner as in Example 8, except that, instead of the TFB thin film (thickness: 10 nm), a mixed thin film (thickness: 80 nm) composed of TFB and a green quantum dot material was formed as the hole transport layer, and a mixed thin film (40 nm) composed of MADN and C545T was formed as an organic EL luminescent layer instead of the quantum dot-containing luminescent layer. The thin layer of the hole transport layer was formed by spin-coating a coating solution prepared by dissolving the quantum dot having a protecting group 1 and TFB at a mixing ratio of quantum dot having a protecting group 1:TFB of 10:3 (weight ratio) in toluene in the air. After the formation of the film, the film was dried on a hot plate at 200° C. for one hr in the air to evaporate toluene. The organic EL luminescent layer was co-deposited by a resistance heat vapor deposition method in vacuo (pressure: $1 \times 10^{-4}$ Pa) so that the volume ratio between MADN and C545T was 20:1.

Example 12

An organic EL device of Example 12 was produced in the same manner as in Example 1 (amount of binder 1:amount of green light emitting QD having a protecting group 6 (weight ratio)=10:3), except that the green light emitting QD constituting the quantum dot-containing luminescent layer was prepared using a material having a protecting group 6 (luminescence wavelength 530 nm, dispersed in toluene) instead of the material having a protecting group 1.

Example 13

An organic EL device of Example 13 was produced in the same manner as in Example 1, except that the quantum dot-containing luminescent layer was formed using a mixed thin film (thickness: 30 nm) containing Tris(4-bromophenyl) aminiumyl hexachloantimonate (abbreviated to TBAHA), which is an oxidant dopant, in addition to the binder 4 and the quantum dot material (QD). This mixed thin film was formed by spin-coating a coating solution prepared by dissolving the binder 4, the green light emitting QD, and TBAHA at a mixing ratio of binder 4:green light emitting QD:TBAHA of 20:6:1 (weight ratio) in toluene in the air. After the formation of the mixed film, the film was dried on a hot plate in the air to evaporate toluene.

Comparative Example 1

An organic EL device of Comparative Example 1 was produced in the same manner as in Example 1, except that the green light emitting QD constituting the quantum dot-containing luminescent layer was prepared using as a protecting material a material having a protecting group 7 of TOPO (manufactured by Evident Technologies, Inc.) (luminescence wavelength 530 nm, dispersed in toluene) instead of the material having the protecting group 1.

Comparative Example 2

An organic EL device of Comparative Example 2 was produced in the same manner as in Example 6, except that the green light emitting QD constituting the quantum dot-containing luminescent layer was prepared using as a protecting material a material having a protecting group 7 of TOPO attached thereto (manufactured by Evident Technologies, Inc.) (luminescence wavelength 530 nm, dispersed in toluene) instead of the material having the protecting group 1.

Comparative Example 3

An organic EL device of Comparative Example 3 was produced in the same manner as in Example 8, except that the green light emitting QD constituting the quantum dot-containing luminescent layer was prepared using as a protecting material a material having a protecting group 7 of TOPO (manufactured by Evident Technologies, Inc.) (luminescence wavelength 530 nm, dispersed in toluene) instead of the material having the protecting group 1.

Comparative Example 4

An organic EL device of Comparative Example 4 was produced in the same manner as in Example 10, except that the luminescent layer was formed using a mixed thin film (thickness: 30 nm) composed of the binder 4 and the green organic fluorescent material C545T but not containing QD instead of the mixed thin film composed of the binder 4, the green QD, and the green organic fluorescent material C545T. This mixed thin film was formed by spin-coating a coating solution prepared by dissolving the binder 4 and C545T at a mixing ratio of binder 4:C545T of 20:1 (weight ratio) in toluene in the air. After the formation of the mixed film, the film was dried on a hot plate in the air to evaporate toluene.

Comparative Example 5

An organic EL device of Comparative Example 5 was produced in the same manner as in Example 1, except that the luminescent layer was formed using a mixed thin film (thickness: 30 nm) composed of C545T instead of the quantum dot material (QD) constituting the quantum dot-containing luminescent layer, and TBAHA as an oxidant dopant. This mixed thin film was formed by spin-coating a coating solution, prepared by dissolving the binder 1, C545T, and TBAHA at a mixing ratio of binder 4:C545T:TBAHA of 20:6:1 (weight ratio) in toluene in the air. After the formation of the mixed film, the film was dried on a hot plate in the air to evaporate toluene.

Example 14

Organic EL devices were produced according to mixing ratios falling within the mixing ratio specified in the present invention in the same manner as in Example 1, except that the mixing ratio of the green light emitting QD constituting the quantum dot-containing luminescent layer was changed from 30 parts by weight to 50 parts by weight, 100 parts by weight, and 150 parts by weight based on 100 parts by weight of the binder. For the organic EL devices thus produced, the brightness half-lifetime and the current efficiency were evaluated to examine the relationship between these properties and the mixing ratio of the green light emitting QD.

Comparative Example 6

An organic EL device of Comparative Example 6 was produced in the same manner as in Example 1, except that the green light emitting QD constituting the quantum dot-containing luminescent layer was prepared using as a protecting material a mixed thin film (thickness: 30 nm) composed of a material (luminescence wavelength 530 nm, dispersed in toluene) having a protecting group 7 of TOPO (manufactured by Evident Technologies, Inc.) instead of the material having the protecting group 1 and, in addition, a protecting group 1. This mixed thin film was formed by spin-coating a coating solution prepared by dissolving the binder 1, the green light emitting QD, and the protecting group 1 at a mixing ratio of binder 1:green light emitting QD:protecting group 1 of 20:6:1 (weight ratio) in toluene in the air. After the formation of the mixed film, the film was dried on a hot plate in the air to evaporate toluene.

<Evaluation>

For the organic EL devices produced in the Examples and Comparative Examples, the brightness, chromaticity, voltage, current efficiency, and brightness half-time were measured. The results are shown in Table 3. For the organic EL device produced in Example 14, the luminescence efficiency and the brightness half-lifetime for each mixing ratio are shown in Table 11 and FIGS. 8 and 9.

For the Examples and Comparative Examples, the binder, protecting group, moiety A of the binder, structure of moiety B of the protecting group, the sum of atomic weights, and solubility parameter are shown in Tables 4 to 10.

Figure 6:
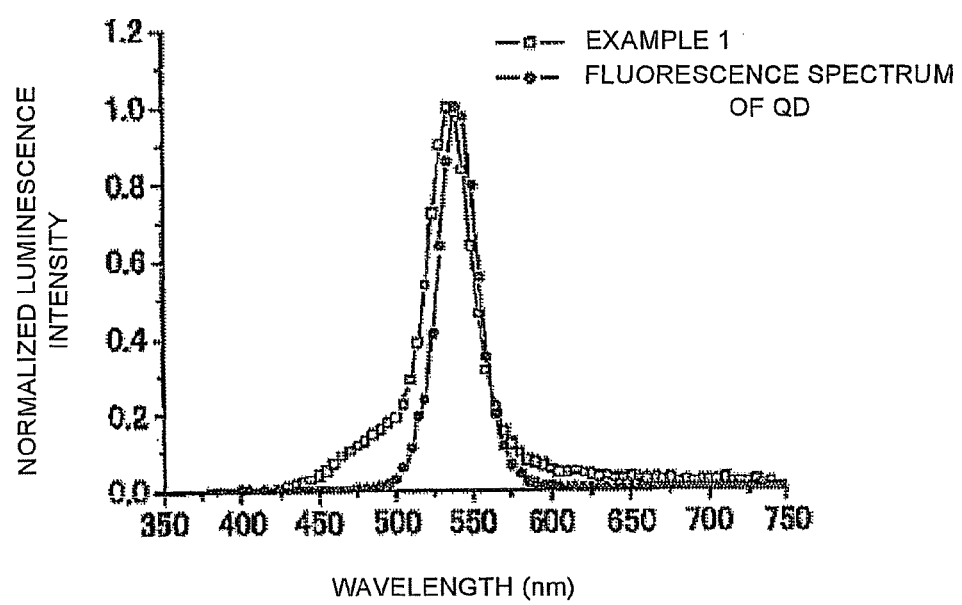
FIG. 6 is a diagram showing an EL spectrum and a fluorescent spectrum of QD in Example 1.

In a spectrum in Examples 1 shown in FIG. 6, luminescence from green QD was confirmed, and the chromaticity CIE (0.25, 0.60) was obtained (Table 3). The shoulder component on a shorter wavelength side than the QD luminescence is a luminescent component from BAlq or TFB. Likewise, also in Examples 1 to 9, luminescence from green QD was confirmed.

The brightness half-time was compared between Example 1 and Comparative Example 1. The lifetime for the brightness half-time for Example 1 was 1.4 times than that for Comparative Example 1. The results suggest that QD having a triphenylamine group used in Example 1 has higher compatibility with the binder 1, that is, smaller |SA−SB|, than QD having a TOPO group used in Comparative Example 1 and thus has higher dispersion stability, resulting in better brightness deterioration resistance caused by driving, that is, better drive lifetime.

Further, the drive lifetime of the organic EL device produced in Example 2 was approximately equal to, that is, 1.07 times, that of the organic EL device produced in Example 1, and the drive lifetime of the organic EL device produced in Example 3 was 1.42 times that of the organic EL device produced in Example 1, indicating that the compatibility of the binder with the protecting group is high, that is, for Example 2, |MA−MB|/MB is preferably small, and, for Example 3, |SA−SB| in addition to |MA−MB|/MB is preferably small.

Further, the drive lifetime of the organic EL device produced in Example 5 was 1.5 times that of the organic EL device produced in Example 4, indicating that the compatibility of the binder with the protecting group is high, that is, |SA−SB| in addition to |MA−MB|/MB is preferably small.

The brightness half-time of the organic EL device produced in Example 6 was compared with that of the organic EL device produced in Comparative Example 2. As a result, it was found that the brightness half-time of the organic EL device produced in Example 6 was 2.27 times that of the organic EL device produced in Comparative Example 2, indicating that the material with the triphenylamine group in Example 6 has higher compatibility with the binder 3 than the material with the TOPO group in Comparative Example 2. That is, it is considered that the smaller |SA−SB| can provide higher dispersion stability and brightness deterioration resistance (drive lifetime) caused by driving the organic EL device. Further, the lifetime of the organic EL device produced in Example 7 was 0.76 time that of the organic EL device produced in Example 6, indicating that the compatibility of the binder with the protecting group is high, that is, Example 6 having smaller |SA−SB| is preferred.

The brightness half-time of the organic EL device produced in Example 8 was compared with that of the organic EL device produced in Comparative Example 3. As a result, it was found that the brightness half-time of the organic EL device produced in Example 8 was 3.5 times that of the organic EL device produced in Comparative Example 3, indicating that the material with the triphenylamine group in Example 8 has higher compatibility with the binder 4 than the material with the TOPO group in Comparative Example 3. That is, it is considered that the smaller |SA−SB| can provide higher dispersion stability and brightness deterioration resistance (drive lifetime) caused by driving the organic EL device. Further, the lifetime of the organic EL device produced in Example 9 was 1.17 times that of the organic EL device produced in Example 8, indicating that the compatibility of the binder with the protecting group is high, that is, the smaller |SA−SB| is preferred.

The chromaticity of the organic EL device produced in Examples 10 was compared with that of the organic EL device produced in Comparative Example 4. As a result, it was found that the color purity of the organic EL device produced in Example 10 which emits light from both the organic fluorescent dopant and QD is higher than that of the organic EL device produced in Comparative Example 4 which emits light from only the organic fluorescent dopant.

Figure 7:
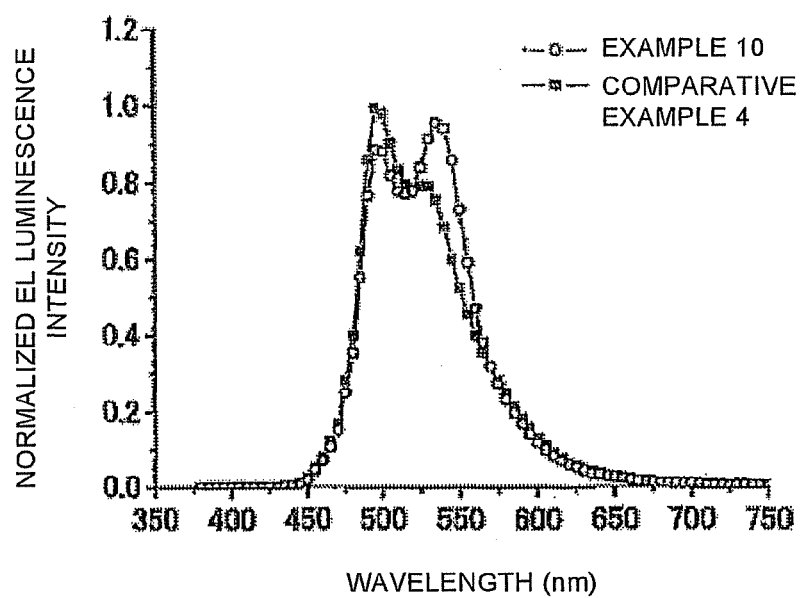
FIG. 7 is a diagram showing EL spectra of Example 10 and Comparative Example 4.

The results indicate that the incorporation of QD in the luminescent layer can easily improved the color purity of the organic EL device (FIG. 7). Further, the organic EL device produced in, Example 10 has current efficiency and brightness half-time (lifetime properties) superior to the organic EL devices produced in Examples 1 to 9, which emit light from only QD, and thus has both organic EL-derived prolonged lifetime properties and QD-derived high color purity. Further, it is apparent that mixing QD into the hole transport layer as in Example 11 can also improve the color purity over that in Comparative Example 4. The reason why the results are obtained is believed to reside in that the luminescent spectrum is improved by superimposition of the QD spectral component having a narrow half-value width on the broad spectral component in the organic phosphor. Light is considered to be emitted from QD in Examples 10 and 11 through any one of a mechanism (1) in which carriers are injected directly into QD to cause light emission by electroluminescence and a mechanism (2) in which QD absorbs light and emits light by photoluminescence upon exposure of the light absorbed QD to an organic fluorescent dopant, or a mechanism in which both the mechanisms simultaneously occur. All the above mechanisms can easily improve the color purity, efficiency, lifetime properties and the like of the organic EL device.

Example 1 was compared with Example 12. As a result, it was found that the difference in luminescence properties such as current efficiency and chromaticity is small, indicating that the influence of the difference in the group of linking to QD on the device properties is small. However, the drive voltage of Example 1 was lower than that of Example 12. The reason for this is believed to reside in that, due to the presence of the phosphodate group, the triphenylamine site is oxidized and a part of the molecules forms a CT complex, contributing to improved electroconductivity.

Example 13 was compared with Comparative Example 5. As a result, in Example 13 containing QD, even the addition of a Lewis acid dopant which is an oxidizing agent has no significant influence on the fluorescent properties, and luminescence and lowered voltage could be confirmed. On the other hand, in Comparative Example 5 containing the organic fluorescent dopant, the fluorescence was lost, and luminescence could not be confirmed. The reason for this is believed to reside in that, in the case of QD, the protecting agent is merely oxidized and a CT complex can be formed without inhibiting the fluorescence of the inorganic phosphor. Thus, QD is superior to the organic fluorescent material. In the Examples, an oxidizing agent is added to the luminescent layer, and the Examples is advantageous in the realization of an increase in thickness, for example, by application to PL such as the addition of QD and the oxidizing agent to the hole transport layer and the like (for example, FIGS. 3 to 5).

Figure 8:
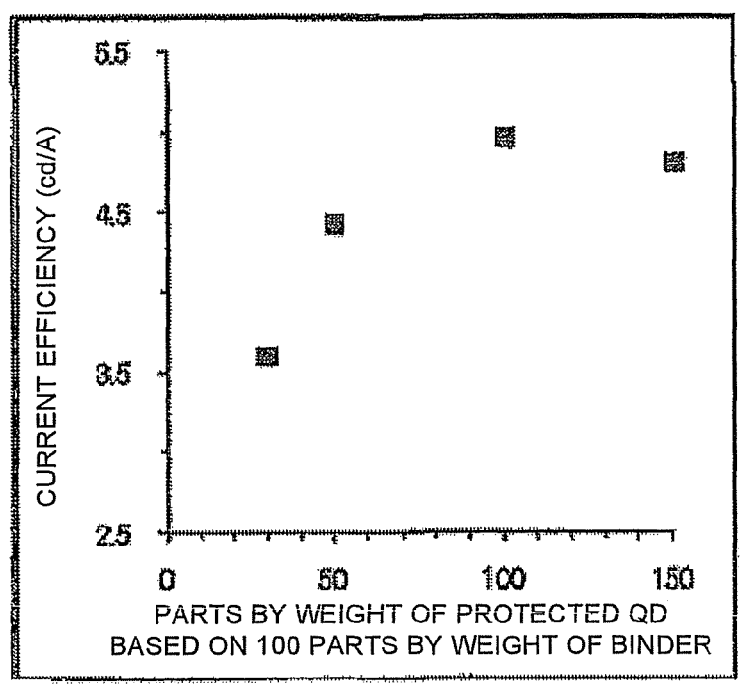
FIG. 8 is a graph showing current efficiency plotted against mixing ratios in an organic EL device produced in Example 14.
Figure 9:
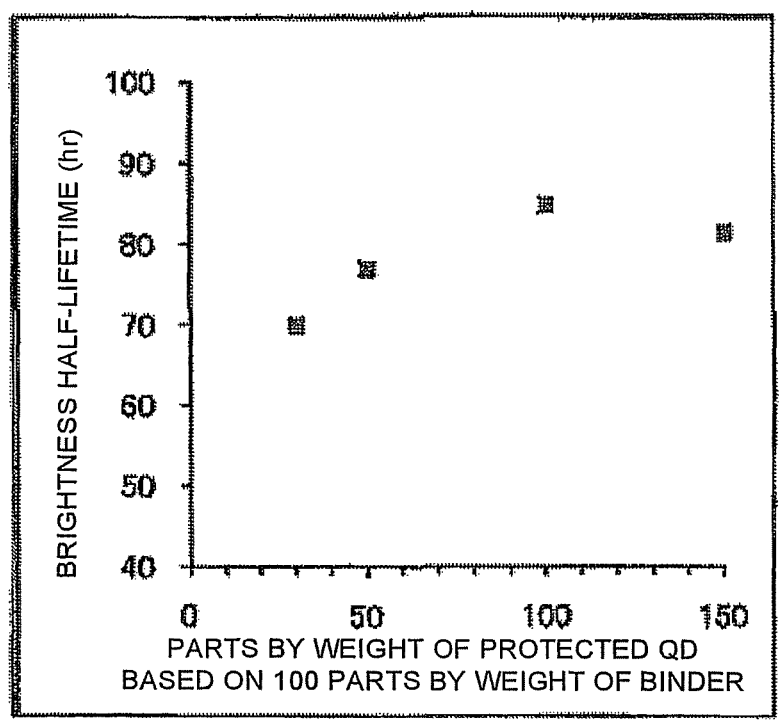
FIG. 9 is a graph showing brightness half-lifetime plotted against mixing ratios in an organic EL device produced in Example 14.

FIGS. 8 and 9 are graphs of current efficiency and brightness half-lifetime in mixing ratios in the organic EL devices produced in Example 14. When the current efficiency in the case where the mixing ratio of the green light emitting QD to the binder is 20% by weight is presumed to be 1, the current efficiency was 1.23 in the case where the mixing ratio was 50% by weight; was 1.38 in the case where the mixing ratio was 100% by weight; and 1.34 in the case where the mixing ratio was 150% by weight, indicating that the current efficiency could be improved by using the quantum dots in relatively larger amounts than those in the conventional technique. Further, when the mixing ratio of the green light emitting QD to the binder was 20% by weight, the brightness half-lifetime was 70 hr, whereas the brightness half-service lives at mixing ratios of 50% by weight, 100% by weight, and 150% by weight were 77 hr, 84.7 hr, and 81.3 hr, respectively, indicating that the use of the quantum dots in relatively larger amounts than those in the conventional technique can prolong the brightness half-lifetime.

In Comparative Example 6, the protecting group 1 used in Example 1 was merely mixed into QD having the TOPO group used in Comparative Example 1. Unlike Comparative Example 6, in Example 1, QD and the protecting group 1 were bonded to each other. The brightness half-lifetime in Comparative Example 6 was equal to that in Comparative Example 1, and the brightness half-time in Example 1 was 1.4 times longer than that in Comparative Example 1.

TABLE 2

| Binder | Structure | Protecting group | Structure |
|---|---|---|---|
| 1 | Poly[9,9-di-n-octylfluorene-alt-(N-(4-sec-butylphenyl)diphenylamine)] with n-$C_8H_{17}$ substituents | 1 | 4-(diphenylamino)phenyl phosphorodichloridate |
| 2 | Poly(9,9-di-n-octylfluorene) with n-$C_8H_{17}$ substituents | 2 | N,N'-bis[4-(dichlorophosphoryloxy)phenyl]-N,N'-diphenylbenzidine |

TABLE 2-continued

| Binder | Structure | Protecting group | Structure |
|---|---|---|---|
| 3 | (structure: N,N'-di-m-tolyl-N,N'-diphenylbenzidine) | 3 | (structure: 9,9-di-n-octylfluorene-phenyl-N-phenyl-phenoxy phosphoryl dichloride) |
| 4 | (structure: 2,6-di(naphthalen-2-yl)-3-methylanthracene derivative) | 4 | (structure: 9,9-di-n-octylfluoren-2-yl phosphoryl dichloride) |
| — | — | 5 | (structure: 9,10-di(naphthalen-2-yl)anthracen-2-yl phosphoryl dichloride) |
| — | — | 6 | (structure: bis[2-(4-(diphenylamino)phenyl)ethyl]phosphine oxide with additional diphenylamino-phenylethyl substituents) |
| — | — | 7 | (structure: tri-n-octylphosphine oxide, (n-C₈H₁₇)₃P=O) |

TABLE 3

|  | Initial properties (100 A/m²) | | | | Lifetime properties (initial brightness 100 cd/m²) |
| --- | --- | --- | --- | --- | --- |
|  | Brightness (cd/m²) | Chromaticity CIE (x, y) | Voltage (V) | Current efficiency (cd/A) | Brightness half-time (hr) |
| Example 1 | 355 | (0.25, 0.60) | 9.5 | 3.6 | 70 |
| Example 2 | 358 | (0.25, 0.59) | 9.6 | 3.6 | 75 |
| Example 3 | 378 | (0.25, 0.60) | 9.6 | 3.8 | 100 |
| Example 4 | 262 | (0.25, 0.59) | 11.5 | 2.6 | 20 |
| Example 5 | 249 | (0.25, 0.58) | 12.6 | 2.5 | 30 |
| Example 6 | 263 | (0.25, 0.59) | 8.9 | 2.6 | 25 |
| Example 7 | 254 | (0.25, 0.59) | 9.3 | 2.5 | 19 |
| Example 8 | 418 | (0.25, 0.60) | 9.5 | 4.2 | 70 |
| Example 9 | 436 | (0.25, 0.58) | 9.5 | 4.4 | 82 |
| Example 10 | 681 | (0.24, 0.58) | 7.7 | 6.8 | 500 |
| Example 11 | 595 | (0.25, 0.56) | 18.5 | 5.9 | 456 |
| Example 12 | 346 | (0.25, 0.60) | 10.0 | 3.5 | 61 |
| Example 13 | 197 | (0.25, 0.62) | 8.5 | 2.0 | 5 |
| Example 14 |  |  |  | Table 10, FIG. 8 | Table 10, FIG. 9 |
| Comparative Example 1 | 317 | (0.25, 0.58) | 11.5 | 3.2 | 50 |
| Comparative Example 2 | 197 | (0.25, 0.58) | 10.7 | 2.0 | 11 |
| Comparative Example 3 | 366 | (0.25, 0.58) | 9.8 | 3.7 | 20 |
| Comparative Example 4 | 696 | (0.24, 0.54) | 6.8 | 7.0 | 450 |
| Comparative Example 5 | Light not emitted | — | — | — | — |
| Comparative Example 6 | 308 | (0.25, 0.58) | 11.8 | 3.1 | 50 |

TABLE 4
| | Example 1 | Example 2 | Example 3 |
|---|---|---|---|
| Binder | 1 | 1 | 1 |
| Moiety A | 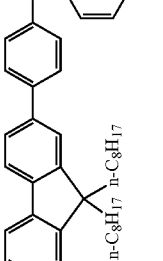 | 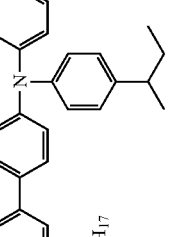 | 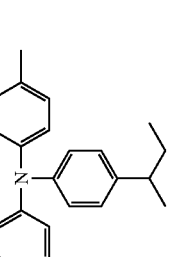 |
| QD protecting group | 1 | 2 | 3 |
| Moiety B | 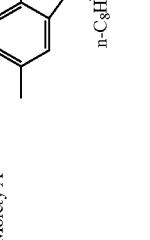 | 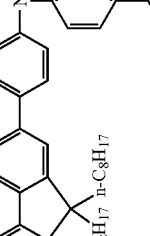 | 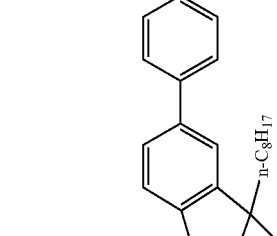 |
| Sum atomic weight of moiety A (MA) | 688 | 688 | 688 |
| Sum atomic weight of moiety B (MB) | 244 | 488 | 633 |
| Atomic weight of moiety B (MB)/molecular weight of protecting material | 0.65 | 0.78 | 0.83 |
| Sum atomic weight of moiety B (MB)/sum atomic weight of X | 1 | 1 | 1 |
| |MA − MB|/MB | 1.8 | 0.4 | 0.1 |
| SA | 18.8 | 18.8 | 18.8 |
| SB | 20.6 | 20.6 | 19.1 |
| |SA − SB| | 1.8 | 1.8 | 0.3 |

TABLE 5
| | Example 4 | Example 5 | Example 6 |
|---|---|---|---|
| Binder | 2 | 2 | 3 |
| Moiety A | 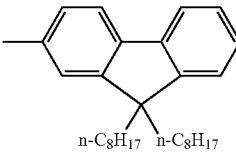 | 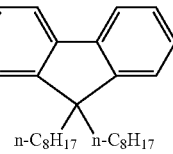 | 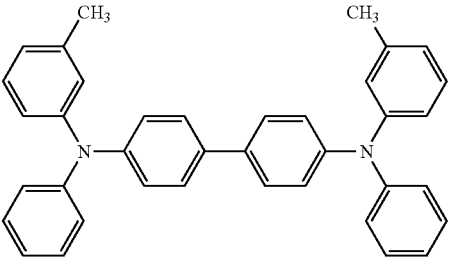 [SMILES: Cc1cccc(N(c2ccccc2)c2ccc(-c3ccc(N(c4ccccc4)c4cccc(C)c4)cc3)cc2)c1] |
| QD protecting group | 1 | 4 | 1 |
| Moiety B | 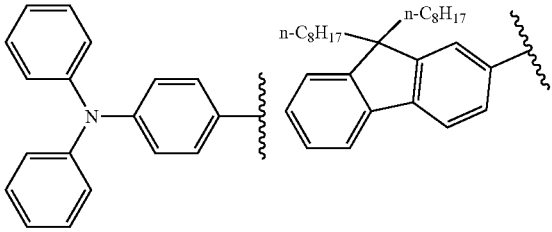 | 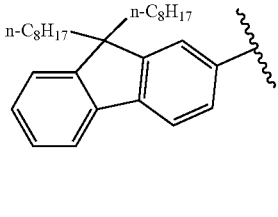 | 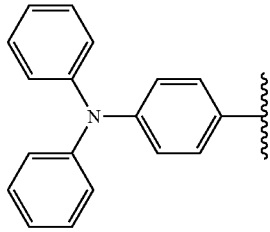 [SMILES: *c1ccc(N(c2ccccc2)c2ccccc2)cc1] |
| Sum atomic weight of moiety A (MA) | 389 | 389 | 517 |
| Sum atomic weight of moiety B (MB) | 244 | 390 | 244 |
| Atomic weight of moiety B (MB)/molecular weight of protecting material | 0.65 | 0.74 | 0.65 |
| Sum atomic weight of moiety B (MB)/sum atomic weight of X | 1 | 1 | 1 |
| |MA − MB|/MB | 0.6 | 0.0 | 1.1 |
| SA | 18.3 | 18.3 | 20.3 |
| SB | 20.6 | 18.3 | 20.6 |
| |SA − SB| | 2.3 | 0 | 0.3 |

TABLE 6
| | Example 7 | Example 8 | Example 9 |
|---|---|---|---|
| Binder | 3 | 4 | 4 |
| Moiety A | 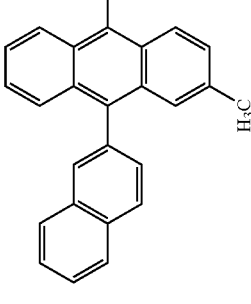 | 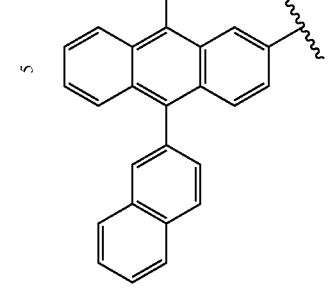 | 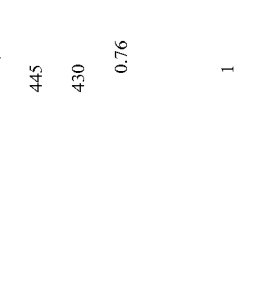 |
| QD protecting group | 4 | 1 | 5 |
| Moiety B | 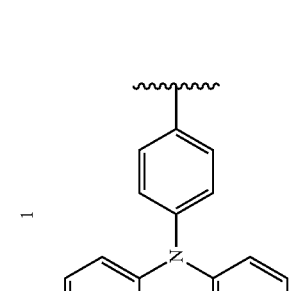 | 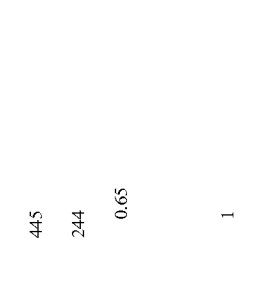 | |
| Sum atomic weight of moiety A (MA) | 517 | 445 | 445 |
| Sum atomic weight of moiety B (MB) | 390 | 244 | 430 |
| Atomic weight of moiety B (MB)/molecular weight of protecting material | 0.74 | 0.65 | 0.76 |
| Sum atomic weight of moiety B (MB)/sum atomic weight of X | 1 | 1 | 1 |
| |MA − MB|/MB | 0.3 | 0.8 | 0.0 |
| SA | 20.3 | 21.7 | 21.7 |
| SB | 18.3 | 20.6 | 21.8 |
| |SA − SB| | 2 | 1.1 | 0.1 |

TABLE 7

| | Example 10 | Example 11 | Example 12 |
|---|---|---|---|
| Binder | | | |
| Moiety A | 4 | 1 | 1 |
| QD protecting group | 1 | 1 | 6 |
| Moiety B | | | |
| Sum atomic weight of moiety A (MA) | 445 | 688 | 688 |
| Sum atomic weight of moiety B (MB) | 244 | 244 | 861 |
| Atomic weight of moiety B (MB)/molecular weight of protecting material | 0.65 | 0.65 | 0.95 |
| Sum atomic weight of moiety B (MB)/sum atomic weight of X | 1 | 1 | 1 |
| |MA − MB|/MB | 0.8 | 1.8 | 0.2 |
| SA | 21.7 | 18.8 | 18.8 |
| SB | 20.6 | 20.6 | 20.2 |
| |SA − SB| | 1.1 | 1.8 | 1.4 |

TABLE 8

| | Example 13 | Comparative Example 1 | Comparative Example 2 |
|---|---|---|---|
| Binder | 4 | 1 | 3 |
| Moiety A | (structure) | (structure) | (structure) |
| QD protecting group | 1 | 7 | 7 |
| Moiety B | (structure) | (structure) ×3 | (structure) ×3 |
| Sum atomic weight of moiety A (MA) | 445 | 688 | 517 |
| Sum atomic weight of moiety B (MB) | 244 | 339 | 339 |
| Atomic weight of moiety B (MB)/molecular weight of protecting material | 0.65 | 0.88 | 0.88 |
| Sum atomic weight of moiety B (MB)/sum atomic weight of X | 1 | 1 | 1 |
| |MA − MB|/MB | 0.8 | 1.0 | 0.5 |
| SA | 21.7 | 18.8 | 20.3 |
| SB | 20.6 | 16.6 | 16.6 |
| |SA − SB| | 1.1 | 2.2 | 3.7 |

TABLE 9

| | Comparative Example 3 | Comparative Example 4 | Comparative Example 5 |
|---|---|---|---|
| Binder | 4 | 4 | 1 |
| Moiety A | (9,10-di(naphthalen-2-yl)-2-methylanthracene structure) | (9,10-di(naphthalen-2-yl)-2-methylanthracene structure) | (triarylamine-fluorene structure with n-C$_8$H$_{17}$ groups and sec-butyl) |
| QD protecting group | 7 | — | — |
| Moiety B | (n-alkyl chain) ×3 | — | — |
| Sum atomic weight of moiety A (MA) | 445 | 445 | 688 |
| Sum atomic weight of moiety B (MB) | 339 | — | — |
| Atomic weight of moiety B (MB)/molecular weight of protecting material | 0.88 | — | — |
| Sum atomic weight of moiety B (MB)/sum atomic weight of X | 1 | — | — |
| |MA − MB|/MB | 0.3 | — | — |
| SA | 21.7 | 16.6 | 18.8 |
| SB | 16.6 | — | — |
| |SA − SB| | 5.1 | — | — |

TABLE 10

| | Example 14 | Comparative Example 6 | |
|---|---|---|---|
| Binder | 1 | 7 | |
| Moiety A | (fluorene-biphenyl-triarylamine structure with n-C$_8$H$_{17}$, n-C$_8$H$_{17}$ substituents) | (dinaphthyl-anthracene structure with H$_3$C substituent) | |
| QD protecting group | 1 | 7 | 1 (Simple mixing) |
| Moiety B | (triphenylamine-phenyl linking group) | (alkyl chain ×3) | (triphenylamine-phenyl linking group) |
| Sum atomic weight of moiety A (MA) | 688 | 688 | 688 |
| Sum atomic weight of moiety B (MB) | 244 | 339 | 244 |
| Atomic weight of moiety B (MB)/molecular weight of protecting material | 0.65 | 0.88 | 0.65 |
| Sum atomic weight of moiety B (MB)/sum atomic weight of X | 1 | 1 | 1 |
| \|MA − MB\|/MB | 1.8 | 1.0 | 1.8 |
| SA | 18.8 | 18.8 | 18.8 |
| SB | 20.6 | 16.6 | 20.6 |
| \|SA − SB\| | 1.8 | 2.2 | 1.8 |

TABLE 11

| | | Mixing ratio (parts by weight of protected QD based on 100 parts by weight of binder) | | | |
|---|---|---|---|---|---|
| | | 30 | 50 | 100 | 150 |
| Example 14 | Current efficiency (Cd/A) | 3.6 | 4.4 | 5.0 | 4.8 |
| | Brightness half-lifetime (hr) (initial brightness 100 cd/m$^2$) | 70.0 | 77.0 | 84.7 | 81.3 |

The invention claimed is:

1. A light emitting device comprising: a substrate; two or more opposed electrodes provided on the substrate; and a luminescent layer provided between two of the electrodes; the light emitting device further optionally comprising a metal layer provided on the electrodes, wherein the luminescent layer contains, as a part of its chemical structure, a compound containing a moiety A having a sum atomic weight MA of 100 or more and quantum dots protected by a protecting material, the sum atomic weight MA of the moiety A is larger than one-third of the molecular weight of the compound comprising the moiety A, the protecting material contains, as a part of its chemical structure, a linking group having the function of connecting to a quantum dot surface and a moiety B that has a sum atomic weight MB of 100 or more, satisfies a relationship between the sum atomic weight MB and the sum atomic weight MA represented by formula (I), and satisfies the requirement that the sum atomic weight MB is larger than one-third of the molecular weight of the protecting material, a solubility parameter SA of the moiety A and a solubility parameter SB of the moiety B satisfy a relationship represented by formula (II):

$|MA-MB|/MB \leq 2$     formula (I); and $|SA-SB| \leq 2$     formula (II), and the compound comprising the moiety A constituting the luminescent layer is a compound represented by chemical formula (2), and the protecting material is a compound represented by chemical formula (3),

[Chemical formula 2]

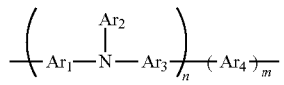

wherein $Ar_1$ to $Ar_4$, which may be the same or different, represent an unsubstituted or substituted aromatic hydrocarbon group having 6 to 60 carbon atoms involved in a conjugated bond, or an unsubstituted or substituted heterocyclic group having 4 to 60 carbon atoms involved in a conjugated bond; n is 1 to 10000 and m is 0 to 10000, provided that n+m=1 to 20000; the two repeating units are arranged in any order; when two or more repeating units represented by the repeating unit

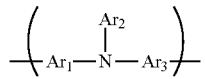

are present in an identical molecule, they may be the same or different; and, when two or more repeating units represented by —(Ar₄)— are present in an identical molecule, they may be the same or different, and Chemical formula (3)

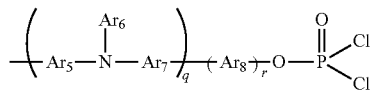

wherein $Ar_5$ to $Ar_8$, which may be the same or different, represent an unsubstituted or substituted aromatic hydrocarbon group having 6 to 60 carbon atoms involved in a conjugated bond, or an unsubstituted or substituted heterocyclic group having 4 to 60 carbon atoms involved in a conjugated bond; q is 1 to 10 and r is 0 to 10, provided that q+r=1 to 20; the two repeating units are arranged in any order; the linking group —O—P(=O)Cl₂ may be linked to a repeating unit —(Ar₈)— or may be linked to another repeating unit

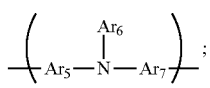

when two or more repeating units represented by the repeating unit

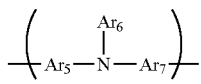

are present in an identical molecule, they may be the same or different; and when two or more repeating units represented by —(Ar₈)— are present in an identical molecule, they may be the same or different.

2. The light emitting device according to claim 1, wherein the quantum dots are semiconductor fine particles and/or dopant-containing semiconductor fine particles that emit light having a color regulated by the particle diameter of the semiconductor fine particles per se and/or the particle diameter of the dopant-containing semiconductor fine particles per se.

3. The light emitting device according to claim 1, wherein the thickness of the luminescent layer is 0.1 to 1000 nm.

4. The light emitting device according to claim 1, wherein the luminescent layer has been formed by a solution coating method.

5. The light emitting device according to claim 1, wherein the light emitting device is an organic EL device that further comprises, in addition to the luminescent layer containing quantum dots, at least an organic luminescent layer.

6. The light emitting device according to claim 1, wherein a particle diameter of the quantum dots is in a range of 0.5 to 20 nm.

* * * * *